(12) United States Patent
Machida

(10) Patent No.: US 8,637,998 B2
(45) Date of Patent: Jan. 28, 2014

(54) SEMICONDUCTOR CHIP AND SEMICONDUCTOR DEVICE

(75) Inventor: Kei Machida, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 64 days.

(21) Appl. No.: 13/317,850

(22) Filed: Oct. 31, 2011

(65) Prior Publication Data

US 2012/0133055 A1 May 31, 2012

(30) Foreign Application Priority Data

Nov. 25, 2010 (JP) ................................. 2010-261967

(51) Int. Cl.
*H01L 23/44* (2006.01)

(52) U.S. Cl.
USPC .............. 257/777; 257/48; 257/208; 257/209

(58) Field of Classification Search
USPC ...................... 257/48, 208, 209, E23.02, 777, 257/E23.141, 203, E27.07
See application file for complete search history.

(56) References Cited

U.S. PATENT DOCUMENTS

| 5,303,120 | A | * | 4/1994 | Michii et al. | 361/760 |
| 5,347,145 | A | * | 9/1994 | Tanaka et al. | 257/48 |
| 5,386,127 | A | * | 1/1995 | Furuyama | 257/48 |
| 5,646,828 | A | * | 7/1997 | Degani et al. | 361/715 |
| 5,703,402 | A | * | 12/1997 | Chu et al. | 257/737 |
| 5,869,894 | A | * | 2/1999 | Degani et al. | 257/723 |
| 5,969,426 | A | * | 10/1999 | Baba et al. | 257/778 |
| 5,991,185 | A | * | 11/1999 | Hachiya | 365/63 |
| 6,008,530 | A | * | 12/1999 | Kano | 257/686 |
| 6,064,113 | A | * | 5/2000 | Kirkman | 257/691 |
| 7,745,932 | B2 | * | 6/2010 | Ko et al. | 257/735 |
| 7,999,383 | B2 | * | 8/2011 | Hollis | 257/758 |
| 8,044,395 | B2 | * | 10/2011 | Lee | 257/48 |
| 8,193,626 | B2 | * | 6/2012 | Park et al. | 257/686 |
| 8,369,099 | B2 | * | 2/2013 | Kim et al. | 361/760 |
| 2003/0116835 | A1 | * | 6/2003 | Miyamoto et al. | 257/678 |
| 2005/0270390 | A1 | * | 12/2005 | Hosokai | 348/294 |
| 2008/0290375 | A1 | * | 11/2008 | Chang et al. | 257/203 |
| 2010/0034005 | A1 | * | 2/2010 | Lee | 365/63 |
| 2010/0117217 | A1 | * | 5/2010 | Park et al. | 257/692 |

(Continued)

FOREIGN PATENT DOCUMENTS

| JP | 63-267598 A | 11/1988 |
| JP | 2-230749 A | 9/1990 |

(Continued)

*Primary Examiner* — Chuong A Luu
*Assistant Examiner* — Jaehwan Oh
(74) *Attorney, Agent, or Firm* — McGinn IP Law Group, PLLC

(57) ABSTRACT

A semiconductor chip capable of realizing reduction in cost when the semiconductor chip is mounted over a package substrate, miniaturization of the package substrate, and optimization of an interconnect pattern. The semiconductor chip includes a first electrode pad group provided in the semiconductor chip, and comprised of at least one electrode pad, and a second electrode pad group provided in the semiconductor chip, and comprised of at least one other electrode pad capable of outputting a signal identical to a signal outputted by the one electrode pad. Further, either the one electrode pad of the first electrode pad group, or the one other electrode pad of the second electrode pad group, closer in distance to one other electrode pad of one other semiconductor chip is coupled to the one other electrode pad of the one other semiconductor chip.

13 Claims, 17 Drawing Sheets

(56) References Cited

U.S. PATENT DOCUMENTS

2010/0195300 A1* 8/2010 Kim et al. .................... 361/760
2012/0012844 A1* 1/2012 Lee ............................... 257/48
2012/0217656 A1* 8/2012 Park et al. .................... 257/777

FOREIGN PATENT DOCUMENTS

| JP | 5-190674 A | 7/1993 |
| JP | 11-067817 A | 3/1999 |
| JP | 2006-041343 A | 2/2006 |

* cited by examiner

SEMICONDUCTOR CHIP AND SEMICONDUCTOR DEVICE

CROSS-REFERENCE TO RELATED TO RELATED APPLICATIONS

The disclosure of Japanese Patent Application No. 2010-261967 filed on Nov. 25, 2010, including the specification, drawings, and abstract, is incorporated herein by reference in its entirety.

BACKGROUND

The present invention relates to a semiconductor chip, and a semiconductor device, and in particular, to a semiconductor chip capable of realizing reduction in cost when the semiconductor chip is mounted over a package substrate, miniaturization of the package substrate, and optimization of an interconnect pattern, and a semiconductor device.

It has lately been required to realize reduction in cost at the time of mounting a semiconductor chip over a package substrate, miniaturization of the package substrate, and optimization of an interconnect pattern.

In Japanese Unexamined Patent Publication No. 2006-41343, there has been disclosed a technology whereby respective solid-state image sensing devices identical to each other are provided with multiple pads to which an identical signal is coupled, thereby enabling the solid-state image sensing device to cope with multiple mounting configurations, and package configurations. FIG. 17 is a view showing the solid-state image sensing device disclosed in Japanese Unexamined Patent Publication No. 2006-41343. In FIG. 17, the solid-state image sensing device 631 includes an internal circuit 632 made up of transistors and so forth, a pad group 634 provided with pad opening metals 636 for use in coupling to the outside of the solid-state image sensing device 631, and a pad group 635. The pad group 634 and the pad group 635 are coupled to each other via the internal circuit 632, and a metal interconnect 633, and the pad group 634 and the pad group 635 include pads 637, and pads 638, respectively, the pads 637, 638 each being for use in receiving or outputting the identical signal With the technology disclosed in Japanese Unexamined Patent Publication No. 2006-41343, the identical signal from the internal circuit 632 is supplied to the pads disposed along multiple sides of the solid-state image sensing device 631 through the metal interconnect 633. Accordingly, in the case of a signal for which it is necessary to secure a pad pitch at the time of wire bonding to a lead frame and so forth, if use is made of the pads with the identical signal coupled thereto, and disposed along different sides of the solid-state image sensing device 631, respectively, this will render it possible to secure the pad pitch that will be needed from a standpoint of mounting.

Further, in the case where mounting at small pitches is possible, including, for example, the case of using bumps and so forth, it is possible to suitably select a pad to be used from among the pads with the identical signal coupled thereto, rendering it possible to use, for example, the pads disposed along only one side of the device.

In Japanese Unexamined Patent Publication No. Hei05 (1993)-190674, there has been disclosed a technology related to a semiconductor chip in which the needs for rearranging respective positions of pads of the semiconductor chip do not arise even in the case of a change inn a direction in which an external lead is guided out when the semiconductor chip is mounted over a package provided with the external lead guided out of two sides thereof, opposite to each other, respectively. In Japanese Unexamined Patent Publication No. Hei02 (1990)-230749, there has been disclosed a technology related to a semiconductor chip in which a pad is disposed over one end face thereof, and a pad identical in function to the pad is also disposed over one other end face thereof, opposite to the one end face.

In Japanese Unexamined Patent Publication No. S63 (1988)-267598, there has been disclosed a technology related to a semiconductor device in which a semiconductor pellet with an integrated circuit formed therein is attached to an IC card substrate. With the technology disclosed in Japanese Unexamined Patent Publication No. S63 (1988)-267598, a bonding pad electrode provided over the surface of the semiconductor pellet is comprised of multiple first bonding pad electrodes disposed in a first disposition state, and multiple second bonding pad electrodes identical in function type to the first bonding pad electrodes, and disposed in a second disposition state differing in disposition state from the first disposition state. Further, either the plural first bonding pad electrodes, or the plural second bonding pad electrodes are electrically continuous with an external terminal lead corresponding thereto.

In Japanese Unexamined Patent Publication No. Hei11 (1999)-67817, there has been disclosed a technology that is capable of coping with a package of a pellet-mount method including face-up type, and face-down type of identical semiconductor memories (pellets) without causing deterioration in memory performance, an increase in memory production cost, and package manufacturing cost. With the semiconductor memory (pellet) disclosed in Japanese Unexamined Patent Publication No. Hei11 (1999)-67817, an externally coupling electrode pad group having an identical function is disposed in both the first quadrant and the second quadrant of the pellet, the first quadrant and the second quadrant being divided by the center line of the a pellet. Further, an externally coupling electrode pad group having the identical function is disposed in either the third quadrant, or the fourth quadrant of the pellet, divided by the second center line of the pellet, orthogonal to the center line thereof. Furthermore, an externally coupling electrode pad group having the identical function is disposed inside the pellet center line having a width corresponding to half the length of a side of the pellet, orthogonal to the pellet center line.

SUMMARY

In the case of coupling multiple semiconductor chips with each other, there exist a problem in that a length of an interconnect between the semiconductor chips becomes greater, or the interconnect becomes complex. If the length of the interconnect becomes greater, interconnect delay occurs, and if a length of a bonding wire becomes greater, or the interconnect becomes complex, this will cause an increase in package size to thereby cause an increase in cost. In the case of the technology disclosed in Japanese Unexamined Patent Publication No. 2006-41343, coupling between the semiconductor chips is not taken into consideration, and therefore, it is not possible to solve such problems as described above.

Thus, in the case of coupling multiple semiconductor chips with each other, a problem has existed in that it has been difficult to realize reduction in cost when the semiconductor chip is mounted over a package substrate, miniaturization of the package substrate, and optimization of an interconnect pattern.

According to one aspect of the invention, there is provided a semiconductor chip including at least one first electrode pad provided in the semiconductor chip, and a second electrode pad capable of outputting a signal identical to a signal outputted from the first electrode pad, the second electrode pad being at least one electrode pad provided in the semiconductor chip. With the semiconductor chip, either of the first electrode pad and the second electrode pad, closer in distance to one other electrode pad of one other semiconductor chip where the signal is supplied, is coupled to the one other electrode pad of the one other semiconductor chip.

With the semiconductor chip according to another aspect of the invention, when the semiconductor chip is coupled to the one other semiconductor chip, either of the first electrode pad and the second electrode pad, closer in distance to the one other electrode pad of the one other semiconductor chip where the signal is supplied, is coupled to the one other electrode pad of the one other semiconductor chip. By so doing, it is possible to inhibit an increase in interconnect length, and interconnect complication when the semiconductor chip is coupled to the one other semiconductor chip. Accordingly, it is possible to realize reduction in cost at the time of mounting the semiconductor chip, miniaturization of the package substrate, and optimization of the interconnect pattern.

According to the aspects of the present invention, there can provide a semiconductor chip capable of realizing reduction in cost at the time of mounting the semiconductor chip, miniaturization of a package substrate, and optimization of an interconnect pattern, and a semiconductor device including the semiconductor chip.

DETAILED DESCRIPTION

Figure 1:
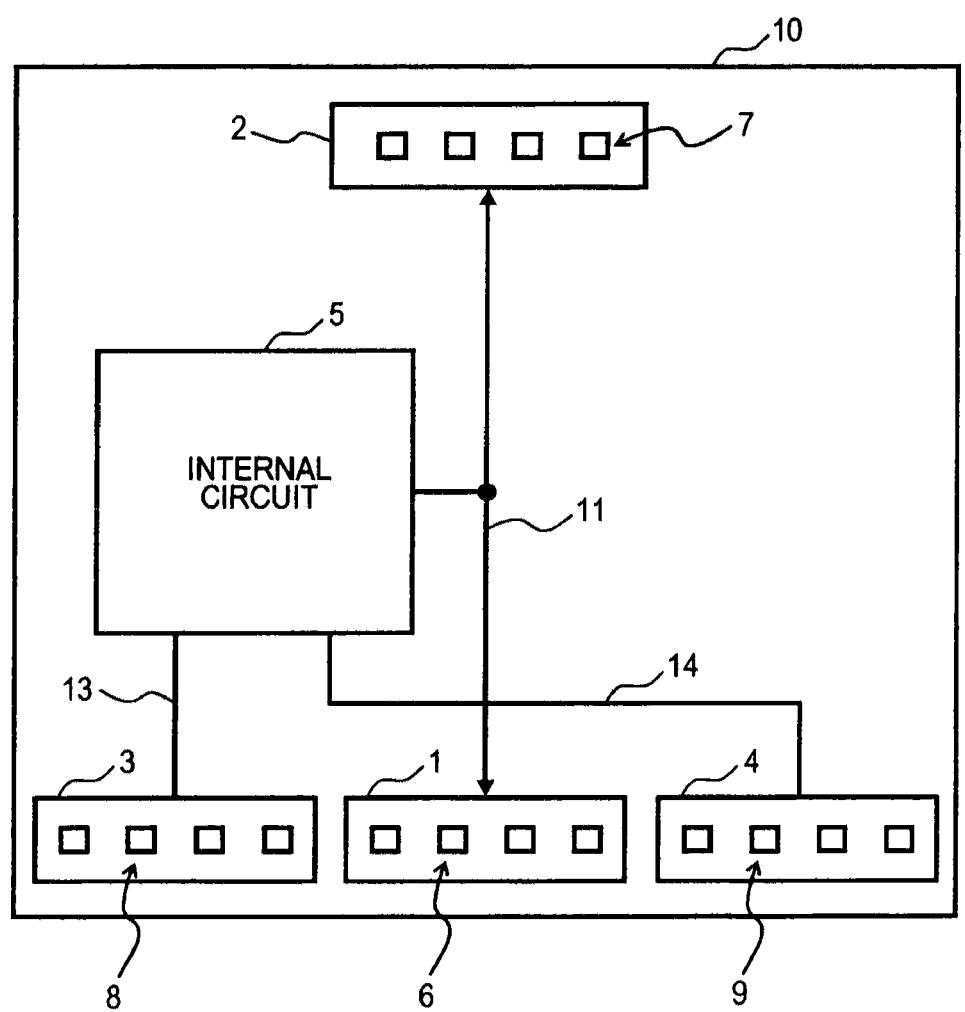
FIG. 1 is a view showing a semiconductor chip according to a first embodiment of the invention.

Preferred Embodiments of the invention are described hereinafter with reference to the accompanying drawings.
First Embodiment FIG. 1 is a view showing a semiconductor chip according to a first embodiment of the invention. The semiconductor chip 10 shown in FIG. 1 is comprised of an electrode pad group (a first electrode pad group) 1, an electrode pad group (a second electrode pad group) 2, electrode pad groups (third electrode pad groups) 3, 4, and an internal circuit 5. Further, it need only be sufficient for the respective electrode pad groups to include at least one electrode pad, and the scope of the present invention is not limited to multiple electrode pads being included in each of the electrode pad groups. However, the embodiments of the invention will be described hereinafter by employing the term "an electrode pad group" for the sake of elucidation of overall coupling relation, and construction with greater ease, in the following description.

Figure 13:
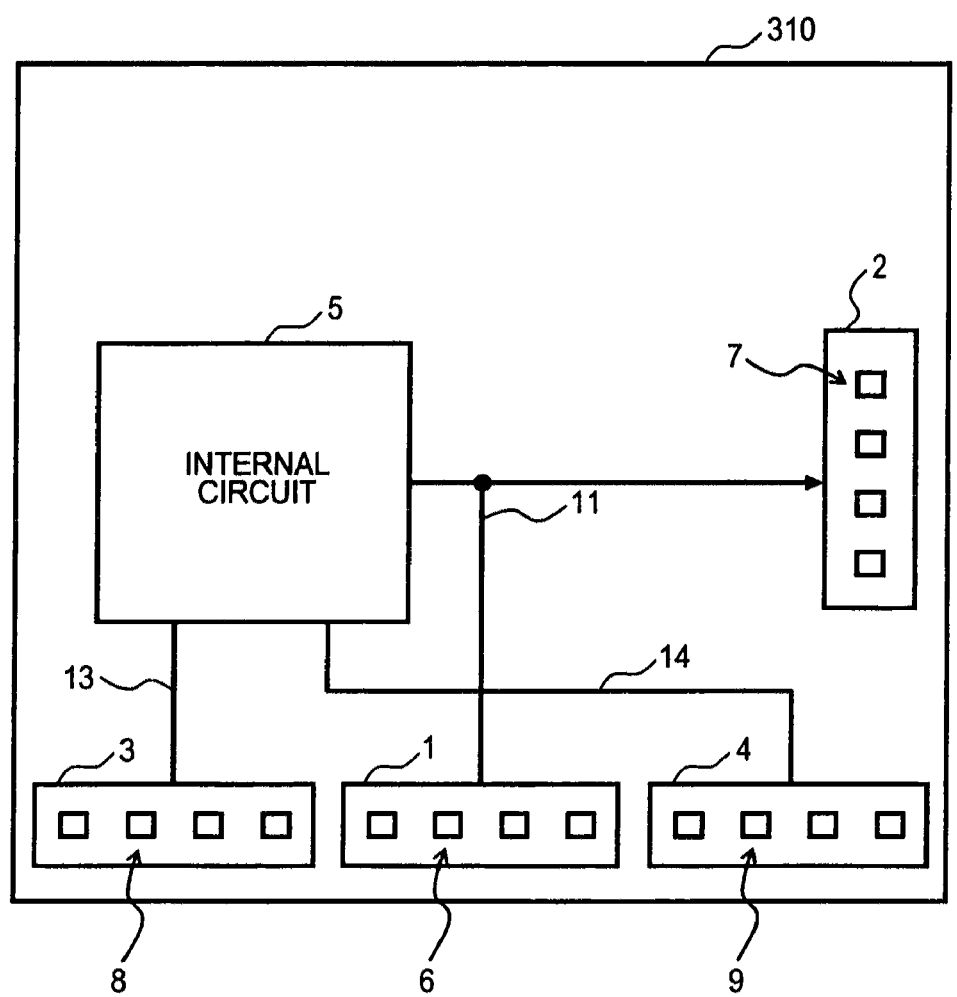
FIG. 13 is a view showing another configuration example of the semiconductor chip according to the first embodiment.

Now, in FIG. 1, the electrode pad group 1 is disposed along one side of the semiconductor chip 10, and is comprised of multiple electrode pads 6. The electrode pad group 2 is disposed along one other side different from the one side of the semiconductor chip 10, and is comprised of multiple electrode pads 7 corresponding to the electrode pads 6 of the electrode pad group 1, respectively. Herein, "multiple electrode pads 7 corresponding to the electrode pads 6 of the electrode pad group 1, respectively" means that a signal identical to a signal supplied to the respective electrode pads 6 of the electrode pad group 1 is supplied to the respective electrode pads 7 of the electrode pad group 2. Further, with an example shown in FIG. 1, the electrode pad group 1, and the electrode pad group 2 are disposed along the respective sides of the semiconductor chip 10, opposite to each other, however, the electrode pad group 1, and the electrode pad group 2 may be disposed along the respective sides thereof, adjacent to each other, as is the case with a semiconductor chip 310 shown in FIG. 13. In other words, the placement of the respective electrode pad groups can be optionally decided, and furthermore, it is not essential that the electrode pad group 2 be disposed along a side different from a side along which the electrode pad group 1 is disposed. More specifically, it need only be sufficient in effect for one electrode pad of the electrode pad group 1 to output a predetermined signal, and for the electrode pad group 2 to be able to output a signal identical to the predetermined signal.

The internal circuit 5 outputs a signal to an electrode pad provided in at least either one of the electrode pad group 1, and the electrode pad group 2, via an interconnect 11. The interconnect 11 is branched out inside the semiconductor chip 10. With the semiconductor chip 10 according to the present embodiment, shown in FIG. 1, the internal circuit 5 outputs an identical signal to the plural electrode pads 6 of the electrode pad group 1, and the plural electrode pads 7 of the electrode pad group, respectively, the identical signal corresponding to the respective electrode pads on a one-to-one basis. That is, the internal circuit 5 outputs the identical signal to one electrode pad of the electrode pad group 1, and one electrode pad of the electrode pad group 2, respectively. Similarly, the internal circuit 5 outputs the identical signal to one other electrode pad of the electrode pad group 1, and one other electrode pad of the electrode pad group 2, respectively. The same applies to an electrode pad other than those electrode pads described. It should be noted that in order to describe with ease that the one electrode pad of the electrode pad group 2 can output a signal identical to a signal outputted by the one electrode pad of the electrode pad group 1, it is simply described for the sake of convenience by way of example that the internal circuit 5 of the semiconductor chip 10 outputs the signal to the respective electrode pads of the electrode pad group 1, and the respective electrode pads of the electrode pad group 2 in the foregoing description.

Further, the internal circuit 5 outputs a signal to multiple electrode pads 8 of the electrode pad group 3 via an interconnect 13. Still further, the internal circuit 5 outputs a signal to multiple electrode pads 9 of the electrode pad group 4 via an interconnect 14.

The semiconductor chip 10 according to the present embodiment may comprise only the electrode pad group 1, and the electrode pad group 2, or may comprise also an electrode pad group besides the electrode pad groups 1 to 4. In other words, in the semiconductor chip 10 according to the present embodiment, it need only be sufficient to comprise at least the electrode pad group 1, and the electrode pad group 2. Further, the internal circuit 5 may output a signal to the respective electrode pads, and the signal may be inputted to the internal circuit 5 via the respective electrode pads.

Figure 2:
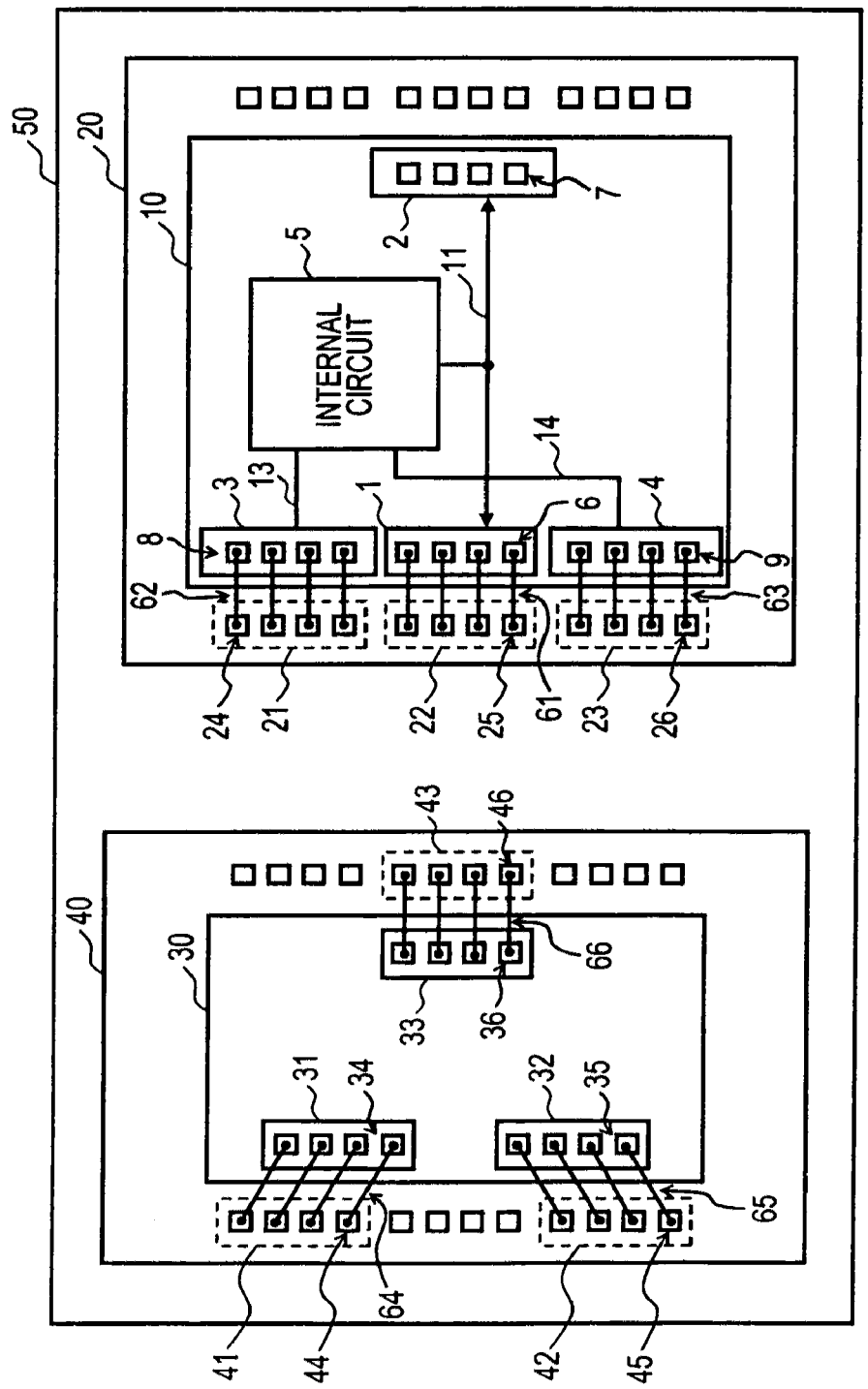
FIG. 2 is a top plan view showing a mounting example of the semiconductor chip according to the first embodiment.
Figure 3:
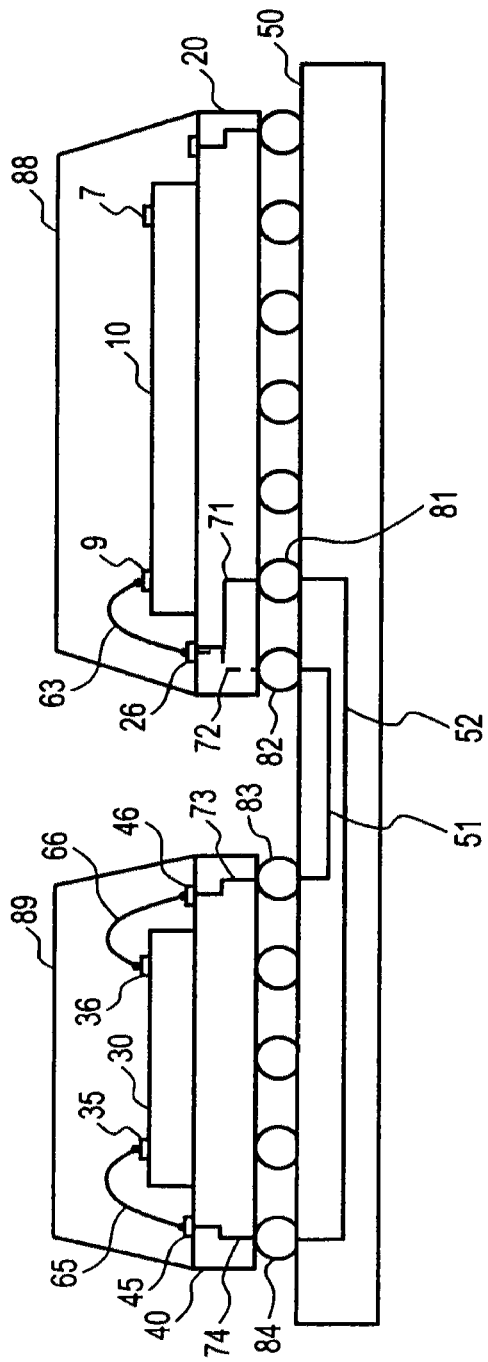
FIG. 3 is a side view showing the mounting example of the semiconductor chip according to the first embodiment.

Next, a mounting example of the semiconductor chip 10 according to the present embodiment is described hereinafter with reference to FIGS. 2, and 3. FIG. 2 is a top plan view showing the mounting example of the semiconductor chip according to the present embodiment. FIG. 3 is a side view showing the mounting example of the semiconductor chip according to the present embodiment. With the mounting example, shown in FIGS. 2, 3, respectively, the semiconductor chip 10, and a semiconductor chip (one other semiconductor chip) 30 are mounted so as to be disposed in a mutually horizontal direction. In the case where multiple semiconductor chips, namely, the semiconductor chip 10, and the semiconductor chip 30 are mounted over a package substrate or a mounting board, these are generically stated as a semiconductor device in the present specification.

Herein, the electrode pad group 1, or the electrode pad group 2, provided in the semiconductor chip 10, is coupled to an electrode pad group 33 provided in the semiconductor chip 30. In this case, because the electrode pad group 1 provided in the semiconductor chip 10 is closer to the electrode pad group 33 provided in the semiconductor chip 30 than the electrode pad group 2, as shown in FIGS. 2, and 3, respectively, the electrode pad group 1 provided in the semiconductor chip 10 is coupled to the electrode pad group 33 provided in the semiconductor chip 30, which is described in detail hereinafter.

As shown in FIG. 3, the semiconductor chip 10 is mounted over a package substrate 20. As shown in FIG. 2, the electrode pad 6 provided in the electrode pad group 1 of the semiconductor chip 10 is coupled to an electrode pad 25 of an electrode pad group 22 of the package substrate 20 via a bonding wire 61 by applying the known bonding wire process thereto. The electrode pad 8 of the electrode pad group 3 of the semiconductor chip 10 is coupled to an electrode pad 24 of an electrode pad group 21 of the package substrate 20 via a bonding wire 62. The electrode pad 9 of the electrode pad group 4 of the semiconductor chip 10 is coupled to an electrode pad 26 of an electrode pad group 23 of the package substrate 20 via a bonding wire 63. At this point in time, use is not made of the electrode pad 7 provided in the electrode pad group 2 of the semiconductor chip 10.

Further, as shown in FIG. 3, the multiple electrode pads 25 provided in the package substrate 20 are in contact with a ball 82 provided on an electrode pad-by-electrode pad basis via an internal interconnect 72 provided on an electrode pad-by-electrode pad basis. Similarly, the multiple electrode pads 24, 26 provided in the package substrate 20 are in contact with a ball 81 provided on an electrode pad-by-electrode pad basis via an internal interconnect 71 provided on an electrode pad-by-electrode pad basis. The semiconductor chip 10, and the package substrate 20 are encapsulated by use of a mold 88.

Further, as shown in FIG. 2, an electrode pad 34 provided in an electrode pad group 31 of the semiconductor chip 30 is coupled to an electrode pad 44 of an electrode pad group 41 of a package substrate 40 via a bonding wire 64 by applying the known bonding wire process thereto. An electrode pad 35 provided in an electrode pad group 32 of the semiconductor chip 30 is coupled to an electrode pad 45 of an electrode pad group 42 of the package substrate 40 via a bonding wire 65. An electrode pad 36 provided in an electrode pad group 33 of the semiconductor chip 30 is coupled to an electrode pad 46 of an electrode pad group 43 of the package substrate 40 via a bonding wire 66.

Further, as shown in FIG. 3, the multiple electrode pads 46 provided in the package substrate 40 are in contact with a ball 83 provided on an electrode pad-by-electrode pad basis via an internal interconnect 73 provided on an electrode pad-by-electrode pad basis. Similarly, the multiple electrode pads 44, 45 provided in the package substrate 40 are in contact with a ball 84 provided on an electrode pad-by-electrode pad basis via an internal interconnect 74 provided on an electrode pad-by-electrode pad basis. The semiconductor chip 30, and the package substrate 40 are encapsulated by use of a mold 89.

The package substrate 20 over which the semiconductor chip 10 is mounted is coupled to the package substrate 40 over which the semiconductor chip 30 is mounted by use of a mounting board 50. That is, the multiple balls 81 provided in the package substrate 20 are coupled to the multiple balls 84 provided in the package substrate 40, respectively, via an internal interconnect 52 provided on an electrode pad-by-electrode pad basis. Similarly, the multiple balls 82 provided in the package substrate 20 are coupled to the multiple balls 83 provided in the package substrate 40, respectively, via an internal interconnect 51 provided on an electrode pad-by-electrode pad basis.

In such a configuration described as above, the electrode pad 6 provided in the semiconductor chip 10 is coupled to the electrode pad 36 provided in the semiconductor chip 30 via the bonding wire 61, the electrode pad 25, the internal interconnect 72, the ball 82, the internal interconnect 51, the ball 83, the internal interconnect 73, the electrode pad 46, and the bonding wire 66. Similarly, the electrode pad 8 provided in the package substrate 10 is coupled to the electrode pad 34 provided in the semiconductor chip 30. Similarly, the electrode pad 9 provided in the semiconductor chip 10 is coupled to the electrode pad 35 provided in the semiconductor chip 30.

The internal interconnects 71, 72, the balls 81, 82, provided in the package substrate 20, the internal interconnects 73, 74, the balls 83, 84, provided in the package substrate 40, and the internal interconnects 51, 52, provided in the mounting board 50, are provided such that the number of each of those constituents corresponds to at least the number of the electrode pads provided in the semiconductor chip 10. Further, as noted in FIG. 2, electrode pads without a bonding wire coupled thereto are shown disposed over the package substrate 40, however, a bonding wire is, in reality, coupled to each of these electrode pads, and other signals are inputted thereto. In this case, for example, a USB signal, and an output signal to a LCD are conceivable as the other signals. Otherwise, a power supply source, and the ground may be coupled to these electrode pads, respectively. However, it will be obviously recognized by those skilled in the art that the scope of the present invention be not limited to these specific examples.

Figure 4:
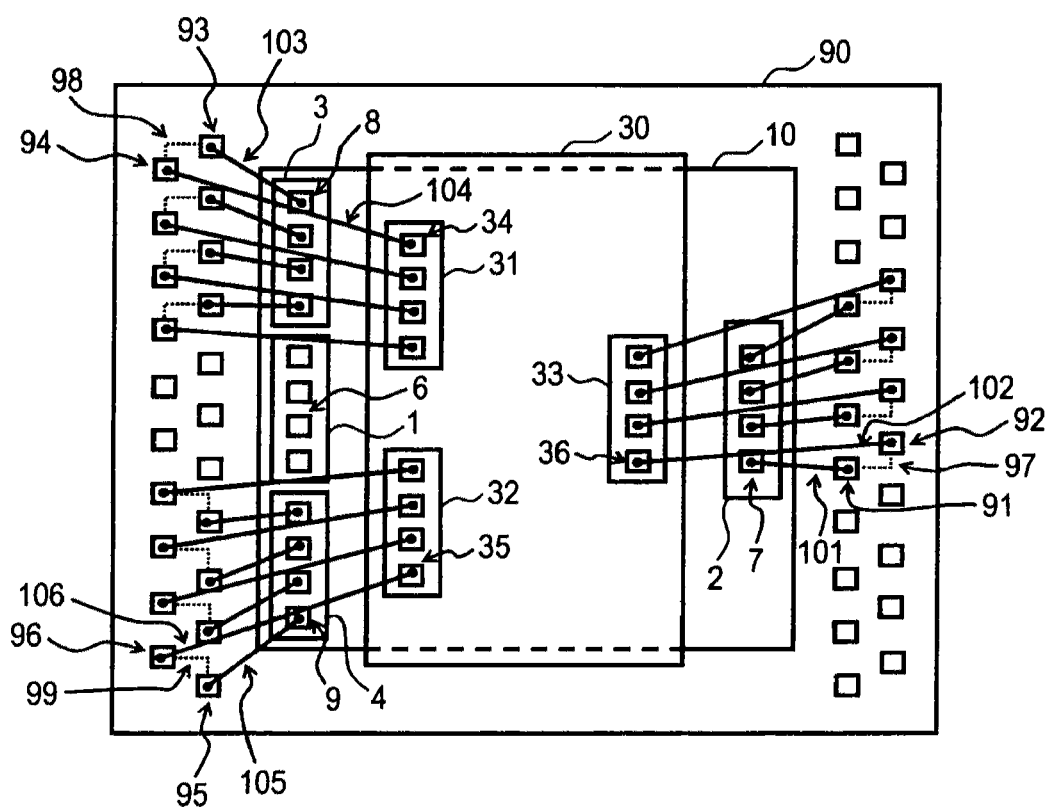
FIG. 4 is a top plan view showing one other mounting example of the semiconductor chip according to the first embodiment.
Figure 5:
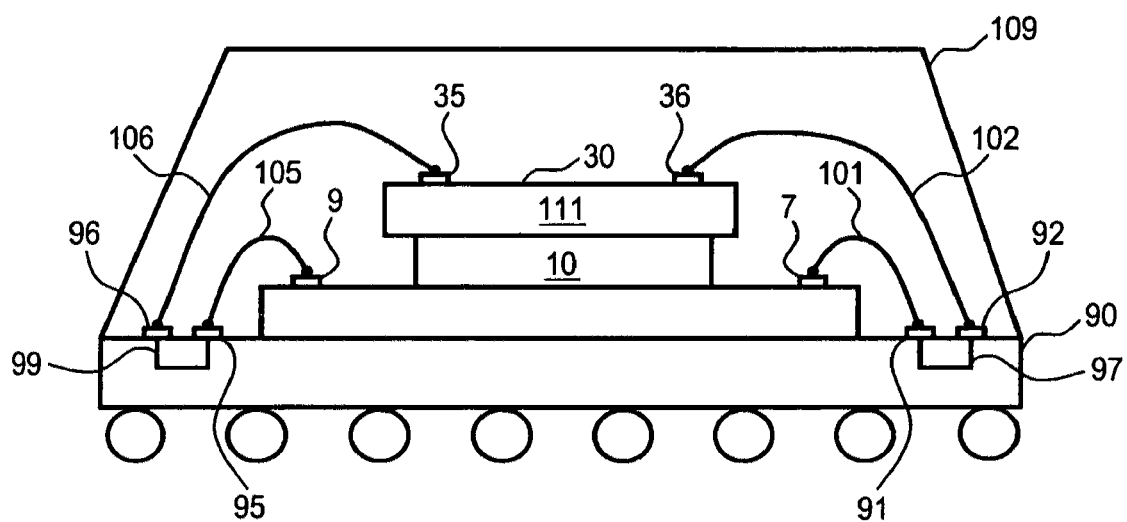
FIG. 5 is a side view showing the one other mounting example of the semiconductor chip according to the first embodiment.

Now, one other mounting example of the semiconductor chip 10 according to the present embodiment is described hereinafter with reference to FIGS. 4, and 5. FIG. 4 is a top plan view showing the one other mounting example of the semiconductor chip according to the present embodiment. FIG. 5 is a side view showing the one other mounting example of the semiconductor chip according to the present embodiment. With the mounting example, shown in FIGS. 4, 5, respectively, the semiconductor chip 10 and the semiconductor chip 30 are stacked one another.

Herein, the electrode pad group 1, or the electrode pad group 2, provided in the semiconductor chip 10, is coupled to the electrode pad group 33 provided in the semiconductor chip 30. In this case, because the electrode pad group 2 provided in the semiconductor chip 10 is closer to the electrode pad group 33 provided in the semiconductor chip 30 than the electrode pad group 1 provided in the semiconductor chip 10, as shown in FIGS. 4, 5, respectively, the electrode pad group 2 is coupled to the electrode pad group 33 provided in the semiconductor chip 30, which is described in detail hereinafter.

As shown in FIG. 5, the semiconductor chip 10 is mounted over a package substrate 90. Further, the semiconductor chip 30 is mounted over the semiconductor chip 10 through the intermediary of a spacer 111. As shown in FIG. 4, the electrode pad 7 of the electrode pad group 2 of the semiconductor chip 10 is coupled to an electrode pad 91 of the package substrate 90 by use of a bonding wire 101. The electrode pad 8 provided in the electrode pad group 3 of the semiconductor chip 10 is coupled to an electrode pad 93 of the package substrate 90 by use of a bonding wire 103. The electrode pad 9 provided in the electrode pad group 4 of the semiconductor chip 10 is coupled to an electrode pad 95 of the package substrate 90 by use of a bonding wire 105. At this point in time, use is not made of the electrode pad 6 provided in the electrode pad group 1 of the semiconductor chip 10.

Further, as shown in FIG. 4, the electrode pad 34 provided in the electrode pad group 31 of the semiconductor chip 30 is coupled to an electrode pad 94 of the package substrate 90 by use of a bonding wire 104. The electrode pad 35 provided in the electrode pad group 32 of the semiconductor chip 30 is coupled to an electrode pad 96 of the package substrate 90 by use of a bonding wire 106. The electrode pad 36 provided in the electrode pad group 33 of the semiconductor chip 30 is coupled to an electrode pad 92 of the package substrate 90 by use of a bonding wire 102.

The electrode pads 91, 92, provided in the package substrate 90, are coupled with each other via an interconnect 97 inside the package substrate 90. Similarly, the electrode pads 93, 94, provided in the package substrate 90, are coupled with each other via an interconnect 98 inside the package substrate 90. Similarly, the electrode pads 95, 96, provided in the package substrate 90, are coupled with each other via an interconnect 99 inside the package substrate 90. Further, the semiconductor chip 10, the package substrate 30, and the package substrate 90 are encapsulated by use of a mold 109

In such a configuration described as above, the electrode pad 7 provided in the semiconductor chip 10 is coupled to the electrode pad 36 provided in the semiconductor chip 30 via the bonding wire 101, the electrode pad 91, the internal interconnect 97, the electrode pad 92, and the bonding wire 102. Similarly, the electrode pad 8 provided in the semiconductor chip 10 is coupled to the electrode pad 34 provided in the semiconductor chip 30 via the bonding wire 103, the electrode pad 93, the internal interconnect 98, the electrode pad 94, and the bonding wire 104. Similarly, the electrode pad 9 provided in the semiconductor chip 10 is coupled to the electrode pad 35 provided in the semiconductor chip 30 via the bonding wire 105, the electrode pad 95, the internal interconnect 99, the electrode pad 96, and the bonding wire 106.

As described in the foregoing, with the present embodiment of the invention, when the respective electrode pads provided in the semiconductor chip 10 are coupled to the respective electrode pads provided in the semiconductor chip 30, the electrode pad group that is put to use is switched over between the electrode pad group 1, and the electrode pad group 2, provided in the semiconductor chip 10, according to a configuration in which the semiconductor chip 10, and the semiconductor chip 30 are mounted.

More specifically, with the example, shown in FIGS. 2, 3, respectively, the semiconductor chip 10, and the semiconductor chip 30 are mounted so as to be disposed in the mutually horizontal direction. In this case, the electrode pad group 1 is put to use because the electrode pad group 1 is closer to the electrode pad group 33 of the semiconductor chip 30, intended for coupling with either the electrode pad group 1, or the electrode pad group 2, by selecting the electrode pad group 1 from the group consisting of the electrode pad group 1, and the electrode pad group, provided in the semiconductor chip 10.

On the other hand, with the example, shown in FIGS. 4, 5, respectively, the semiconductor chip 10 and the semiconductor chip 30 are mounted so as to be stacked one another. At this point in time, the electrode pad group 2 is put to use because the electrode pad group 2 is closer to the electrode pad group 33 of the semiconductor chip 30, intended for coupling with either the electrode pad group 1, or the electrode pad group 2, by selecting the electrode pad group 2 from the group consisting of the electrode pad group 1, and the electrode pad group, provided in the semiconductor chip 10.

In other words, with the present embodiment, when the semiconductor chip 10, and the semiconductor chip (the one other semiconductor chip) 30 are coupled to each other, use is made of the electrode pads of an electrode pad group that is at a shorter distance from the electrode pads of the semiconductor chip (the one other semiconductor chip) 30

Thus, with the semiconductor chips according to the present embodiment, the electrode pad group put to use is switched when the plural semiconductor chips are coupled with each other, and it is therefore possible to inhibit an increase in length between the semiconductor chips, and complication in interconnect. More specifically, through selection of the electrode pad to be put to use for every packaging configuration upon mounting, a bonding wire length, and a interconnect pattern in a substrate can be optimized on a package-by-package basis. By so doing, it is possible to provide a semiconductor chip capable of realizing reduction in cost when the semiconductor chip is mounted over a package substrate, miniaturization of the package substrate, and optimization of an interconnect pattern, and a semiconductor device including the semiconductor chip.

Now, there is described hereinafter a specific example of the semiconductor chip according to the present embodiment. With the specific example described hereinafter, the semiconductor chip 10 described with reference to FIGS. 1 to 5 is referred to as a semiconductor chip 210, and the semiconductor chip 30 described with reference to FIGS. 2 to 5 is referred to as a memory chip (LpDDR: Low-Power DDR). In this connection, LpDDR refers to a DDR that is different from a common DRAM for use in a PC, and so forth, representing a low power consumption version DRAM standard intended for use in a portable device, and so forth. More specifically, there are available LpDDR, and LpDDR2, and for the present embodiment, use can be made of LpDDR of, for example, Max. 400 Mbps. However, it is apparent to those skilled in the art that the semiconductor chip 30 be not limited to this LpDDR. Further, LpDDR can also be called a low power consumption version of a DDR1 type DRAM.

Figure 6:
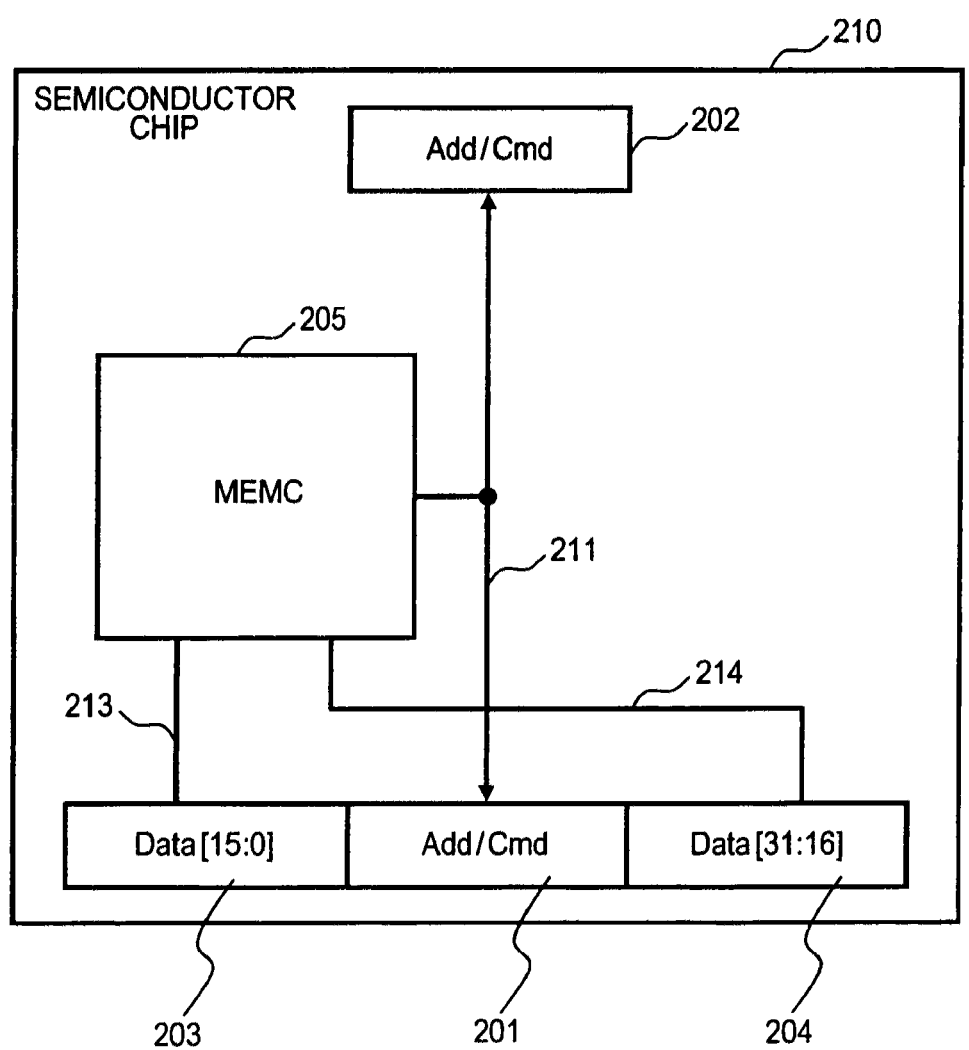
FIG. 6 is a view showing a specific example of the semiconductor chip according to the first embodiment.

FIG. 6 is a view showing a specific example (a semiconductor chip) of the semiconductor chip according to the present embodiment. The semiconductor chip 210 shown in FIG. 6 is comprised of electrode pad groups 201 to 204, and a memory controller (MEMC) 205.

The electrode pad groups 201, 202 each are provided with an identification terminal, and an address and command (Add/cmd) signal is outputted from the identification terminal. The electrode pad group 201 and the electrode pad group 202 are disposed at respective positions opposite to each other. The memory controller 205 outputs the address and command signal (Add/cmd) to the electrode pad group 201, and the electrode pad group 202, respectively, via an interconnect 211. The interconnect 211 is branched out inside the semiconductor chip 210.

The electrode pad group 203 is a terminal for receiving and outputting a data signal (15:0), and the electrode pad group 203 and the electrode pad group 201 are disposed along the same side of the semiconductor chip 210. The memory controller 205 is coupled to the electrode pad group 203 by use of an interconnect 213. Similarly, the electrode pad group 204 is a terminal for receiving and outputting a data signal (31:16), and is disposed along one side of the semiconductor chip 210, identical to the side thereof, along which the electrode pad group 201 is disposed. The memory controller 205 is coupled to the electrode pad group 204 by use of an interconnect 214. Further, an output buffer for the address and command signal, and an input/output buffer for data are present in the semiconductor chip 210, and are coupled to respective circuits as desired via respective interconnects.

Figure 7:
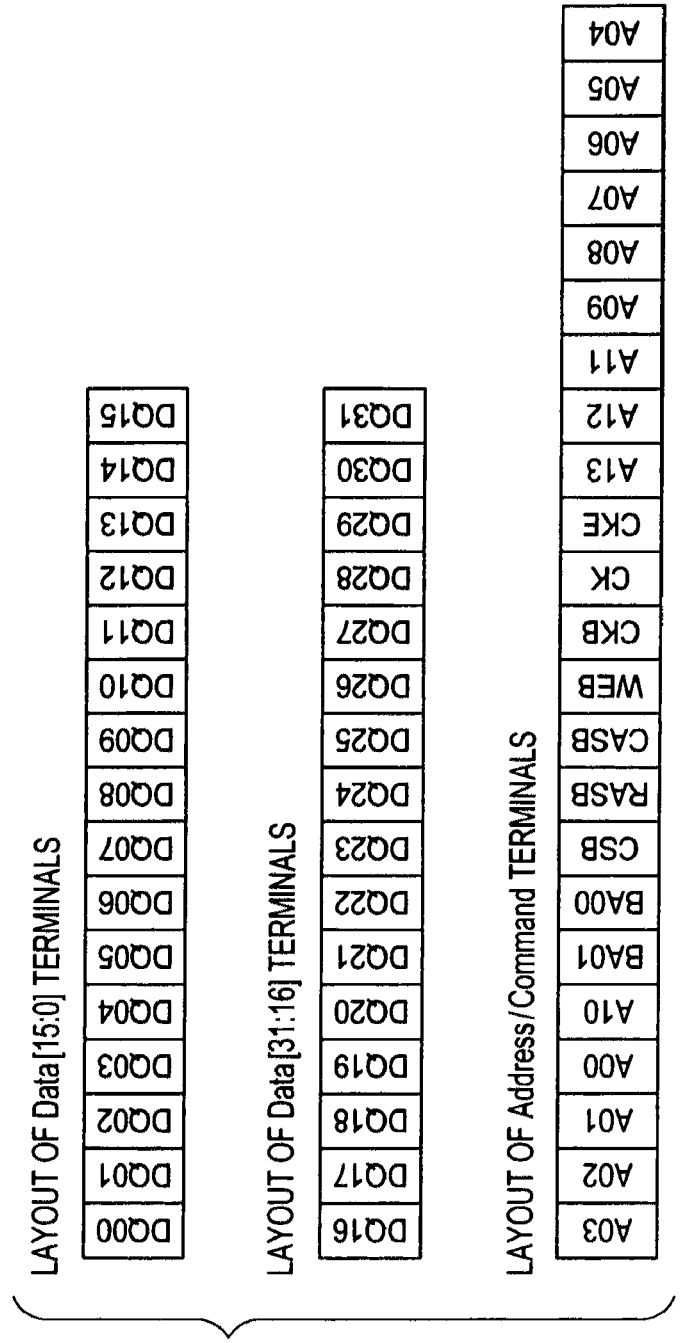
FIG. 7 is a view showing a layout of electrode pads in the case of the specific example shown in FIG. 6.

FIG. 7 is a view showing a layout of electrode pads, provided in each of the electrode pad groups 201 to 204 of the semiconductor chip 210. The data (15:0) terminals of the electrode pad group 203 are disposed in a manner like DG00 to DG15 as shown in FIG. 7. The data (31:16) terminals of the electrode pad group 204 are disposed in a manner like DG16 to DG31 as shown in FIG. 7. The address/command terminals of the electrode pad groups 201, 202, respectively, are disposed as shown in FIG. 7. Further, respective signals are specifically described as follows. That is, A00 to A13 each represent respective bits of an address signal, CSB represents a chip select inverting signal, RASE a row address strobe inverting signal, CASB a column address strobe inverting signal, WEB a write-enable inverting signal, CKB inversion of a clock signal, CK a clock signal, and CKE a clock-enable signal, BA00, BA01 each representing an input signal for designating Bank Address. LpDDR has a memory region divided into four parts, respective regions being referred to as Bank (Bank0 to Bam3). BA00, BA01 each control which Bank to be rendered active, and so forth. However, it is apparent to those skilled in the art that description given above is intended simply to specifically explain about the embodiment of the invention, and that the scope of the invention be not limited to such a specific configuration as above.

Figure 8:
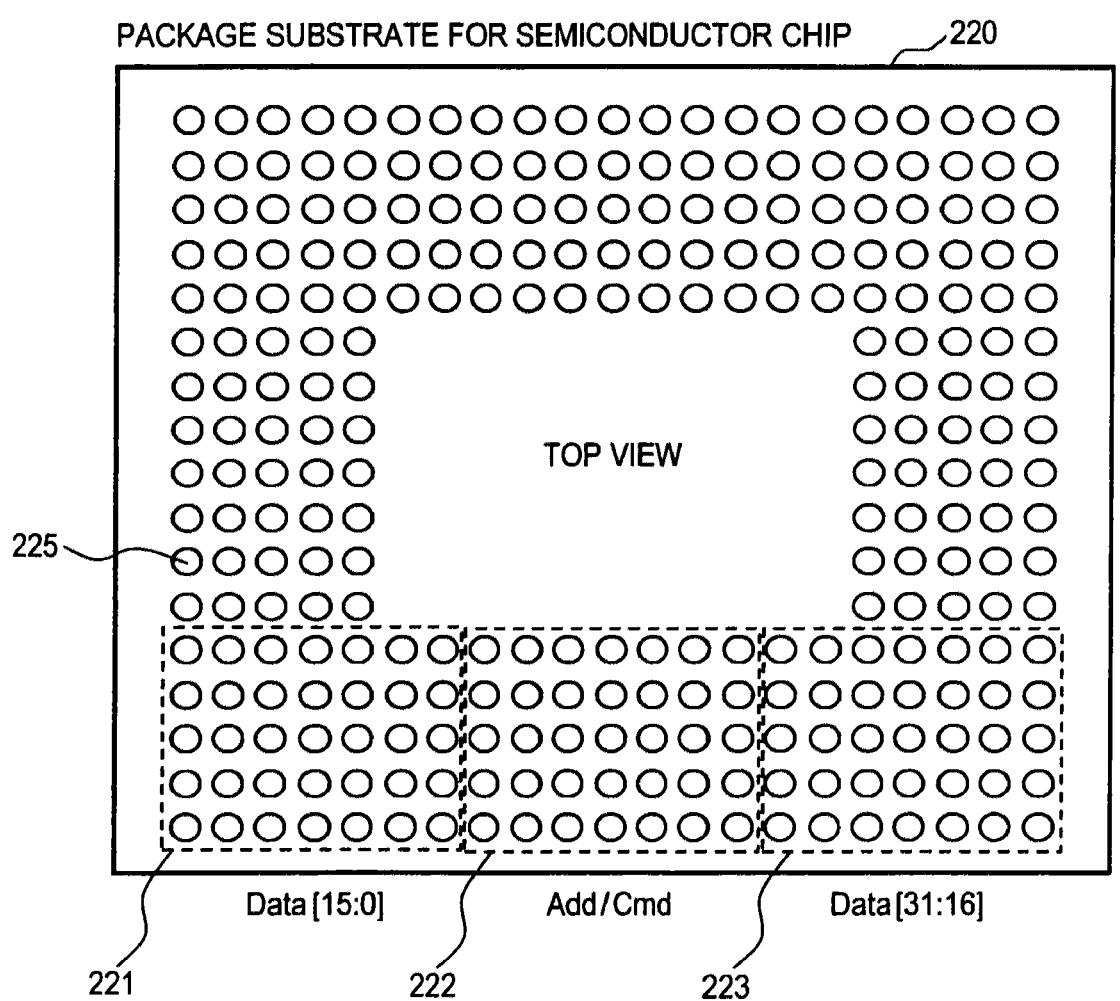
FIG. 8 is a view showing an example of a package substrate over which the semiconductor chip according to the first embodiment is mounted.

FIG. 8 is a view showing an example of a package substrate 220 where the semiconductor chip 210 shown in FIG. 6, is mounted. Herein, the package substrate 220 of FIG. 8 corresponds to the package substrate 20 described with reference to FIGS. 2, and 3. FIG. 8 is a view of the package substrate 220 as seen from above, and in reality, balls 225 are disposed under the package substrate. Further, the package substrate 220 is put to use in the case where the semiconductor chip 210 and a memory chip 230 are disposed in the mutually horizontal direction (refer to FIG. 11).

As shown in FIG. 8, the multiple balls 225 are disposed in the package substrate 220. The respective balls 225 are coupled to the electrode pads (not shown) provided in the upper part of the package substrate 220 via respective internal interconnects (not shown) of the package substrate 220.

With the example shown in FIG. 8, the balls coupled to the data (15:0) terminals provided in the electrode pad group 203 of the semiconductor chip 210, respectively, are disposed in a region 221. The balls coupled to the (Add/cmd) terminals provided in the electrode pad group 201 of the semiconductor chip 210, respectively, are disposed in a region 222. Further, the balls coupled to the data (31:16) terminals provided in the electrode pad group 204 of the semiconductor chip 210, respectively, are disposed in a region 223.

Figure 9:
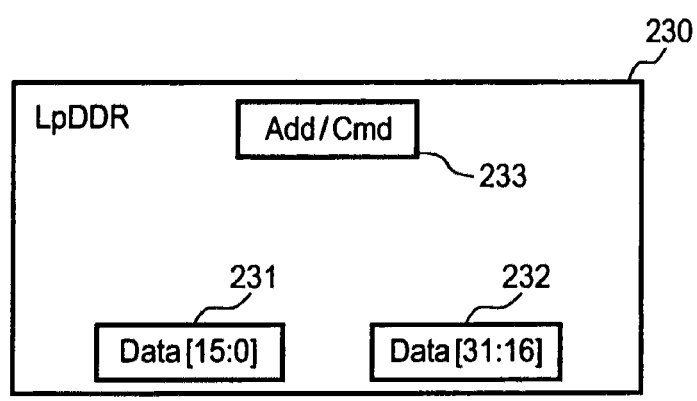
FIG. 9 is a view showing a memory chip, the memory chip together with the semiconductor chip according to the first embodiment is to be mounted.

FIG. 9 is a view showing a memory chip, the memory chip together with the semiconductor chip 210 shown in FIG. 6 is mounted. As shown in FIG. 9, the memory chip 230 includes electrode pad groups 231 to 233. The electrode pad group 231 is a terminal for inputting and outputting the data signal (15:0). The electrode pad group 232 is a terminal for inputting and outputting the data signal (31:16). The electrode pad group 231 and the electrode pad group 232 are disposed along the same side of the memory chip 230. The electrode pad group 233 is a terminal for receiving the address and command signal (Add/cmd). The electrode pad group 233 is disposed along one side of the memory chip 230, opposite to the side thereof, along which the electrode pad group 231, and the electrode pad group 232 are disposed.

When the semiconductor chip 210 and the memory chip 230 are mounted, the electrode pad group 231 of the memory chip 230 is coupled to the electrode pad group 203 of the semiconductor chip 210. Further, the electrode pad group 232 of the memory chip 230 is coupled to the electrode pad group 204 of the semiconductor chip 210. Furthermore, the electrode pad group 233 of the memory chip 230 is coupled to the electrode pad group 201, or the electrode pad group 202 of the semiconductor chip 210.

Figure 10:
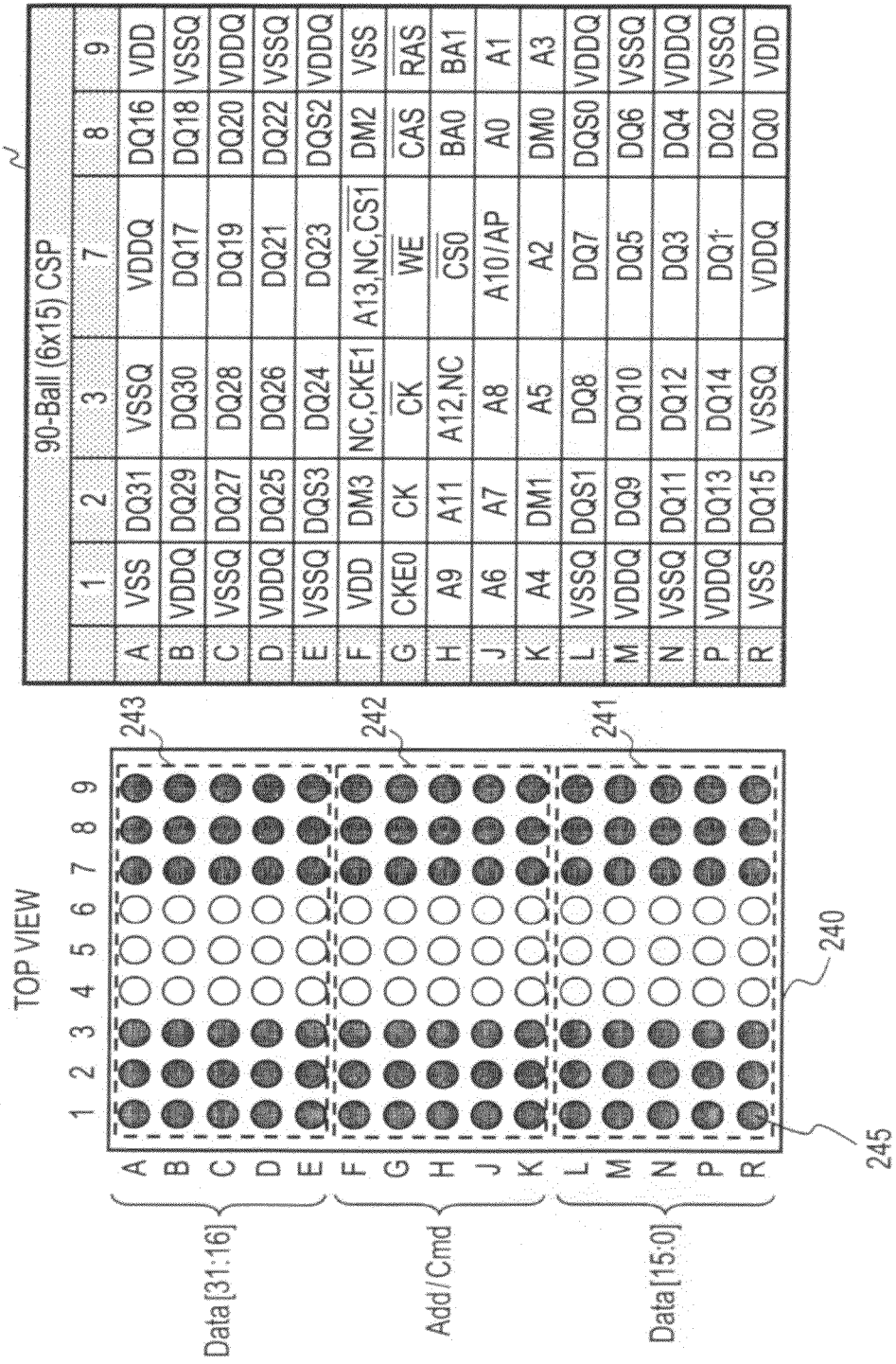
FIG. 10 is a view showing an example of a package substrate over which the memory chip together with the semiconductor chip according to the first embodiment is to be mounted.

FIG. 10 is a view showing an example of a package substrate over which the memory chip shown in FIG. 9 is mounted. Herein, a package substrate 240 shown in FIG. 10 corresponds to the package substrate 40 described with reference to FIGS. 2, and 3. FIG. 10 is a view of the package substrate 240 as seen from above, and in reality, balls 245 are disposed under the package substrate. Further, the package substrate 240 is put to use in the case where the semiconductor chip 210 and the memory chip 230 are disposed in the mutually horizontal direction (refer to FIG. 11).

As shown in FIG. 10, the multiple balls 245 are disposed in the package substrate 240. The respective balls 245 are coupled to electrode pads (not shown) provided in the upper part of the package substrate 240 via respective internal interconnects (not shown) of the package substrate 240.

With the example shown in FIG. 10, the balls coupled to the data (15:0) terminals provided in the electrode pad group 231 of the memory chip 230, respectively, are disposed in a region 241. Further, the balls coupled to the data (31:16) terminals provided in the electrode pad group 232 of the memory chip 230, respectively, are disposed in a region 243. Furthermore, the balls coupled to the (Add/cmd) terminals provided in the electrode pad group 233 of the memory chip 230, respectively, are disposed in a region 242.

In a table of FIG. 10, there are shown the terminals of the memory chip 230, and signs A to R, and numerals 1 to 9, in the table, correspond to respective positions (identified by A to R, 1 to 9, respectively) of the balls disposed over the memory chip 230. For example, the ball indicated by a position A-1 is coupled to "VSS" of the memory chip 230. Similarly, the ball indicated by a position N-3 is coupled to "DQ12" of the memory chip 230.

Figure 11:
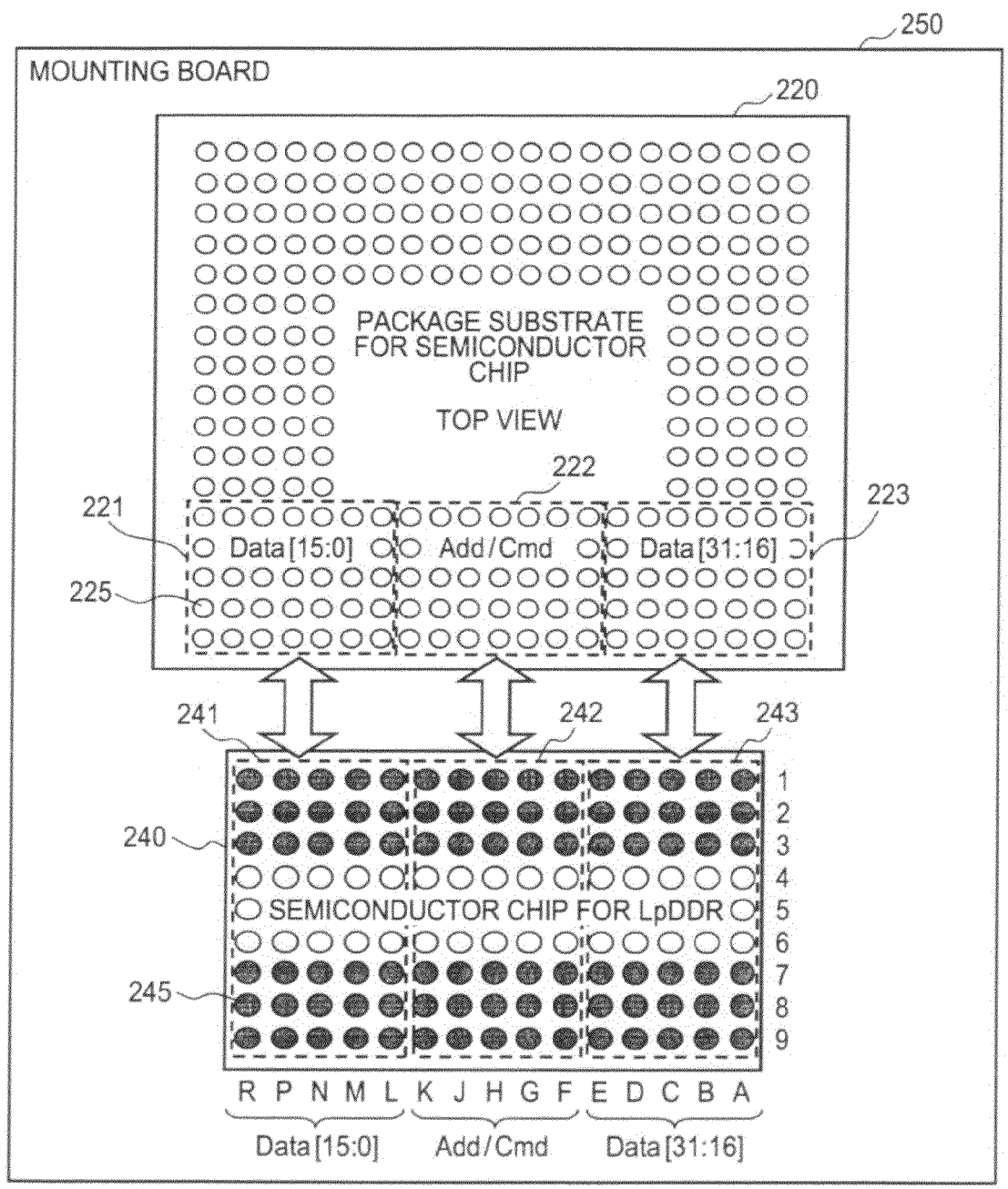
FIG. 11 is a view showing an example in which the package substrate shown in FIG. 8, and the package substrate shown in FIG. 10 are mounted over a mounting board.

FIG. 11 is a view showing a state in which the package substrate 220 shown in FIG. 8 and the package substrate 240 shown in FIG. 10 are mounted over a mounting board 250. Further, the semiconductor chip 210 is mounted over the package substrate 220, and the memory chip 230 is mounted over the package substrate 240 (not shown in FIG. 11).

As shown in FIG. 11, the package substrate 220, and the package substrate 240 are disposed such that the region 221 where the balls corresponding to the data (15:0) terminals of the package substrate 220, respectively, are disposed is opposed to the region 241 where the balls corresponding to the data (15:0) terminals of the package substrate 240, respectively, are disposed, the region 222 where the balls corresponding to the (Add/cmd) terminals of the package substrate 220, respectively, are disposed is opposed to the region 242 where the balls corresponding to the (Add/cmd) terminals of the package substrate 240, respectively, are disposed, and the region 223 where the balls corresponding to the data (31:16) terminals of the package substrate 220, respectively, are disposed is opposed to the region 243 where the balls corresponding to the data (31:16) terminals of the package substrate 240, respectively, are disposed.

Further, the ball corresponding to the data (15:0) terminal of the package substrate 220 is coupled to the ball corresponding to the data (15:0) terminal of the package substrate 240 via an internal interconnect (not shown) of the mounting board 250. Similarly, the ball corresponding to the (Add/cmd) terminal of the package substrate 220 is coupled to the ball corresponding to the (Add/cmd) terminal of the package substrate 240 via an internal interconnect (not shown) of the mounting board 250. Further, the ball corresponding to the data (31:16) terminal of the package substrate 220 is similarly coupled to the ball corresponding to the data (31:16) terminal of the package substrate 240 via an internal interconnect (not shown) of the mounting board 250.

In the case where the semiconductor chip 210 and the memory chip 230 are disposed in the mutually horizontal direction as shown in FIG. 11, external terminals (the balls) of the package substrate 220 over which the semiconductor chip 210 is mounted are collectively disposed on a side of the package substrate 220, closer to the memory chip 230 mounted over the mounting board 250. At this point in time, the electrode pad groups 201, 203, 204, disposed along one side of the semiconductor chip 210, are put to use. With the adoption of such a configuration as described, it is possible to shorten a bonding wire length, and simplify an interconnect pattern of the package substrate. Further, when the semiconductor chip 210 is coupled to the memory chip 230, use is made of internal interconnects of the mounting board 250, and in order to prevent deterioration in performance, the mounting board is designed such that the interconnects of respective signal lines are rendered equal to each other.

Figure 12:
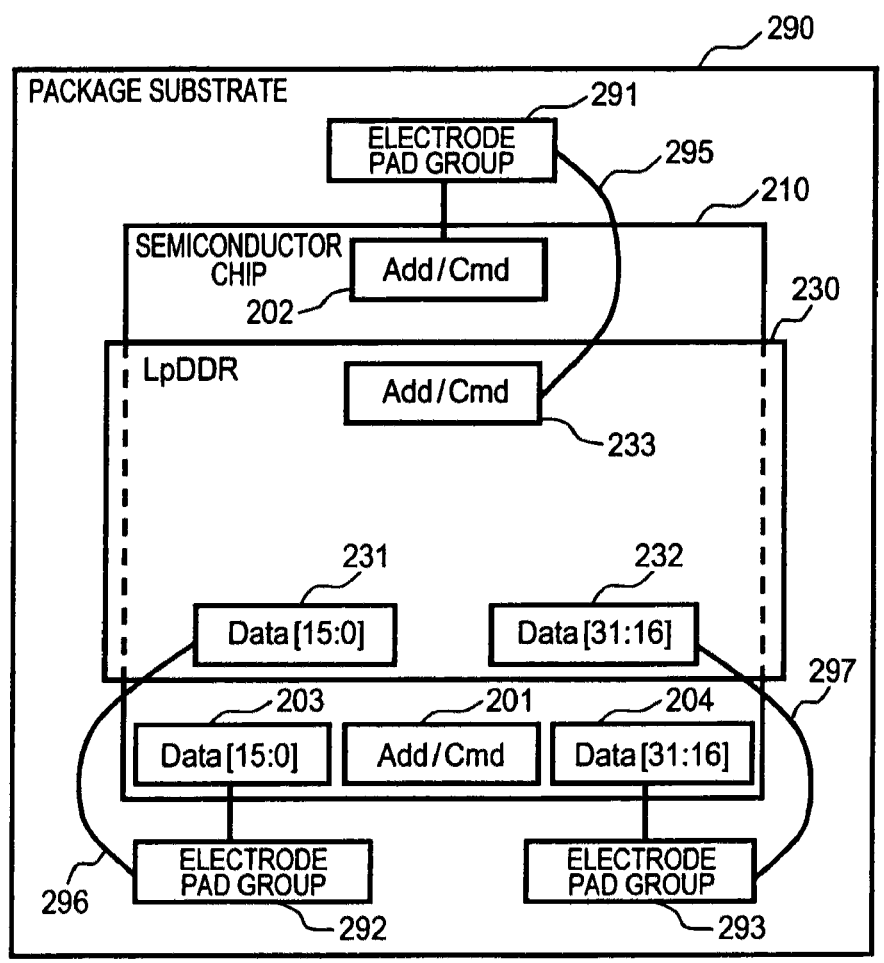
FIG. 12 is a view showing an example in which the semiconductor chip according to the first embodiment, and the memory chip are stacked one another so as to be mounted.

Subsequently, there is described the case where the semiconductor chip 210 and the memory chip 230 are stacked one another so as to be mounted with reference to FIG. 12. In FIG. 12, the semiconductor chip 210 is mounted over a package substrate 290. Further, the memory chip 230 is mounted over the semiconductor chip 210. A configuration shown in FIG. 12 corresponds to that shown in FIG. 4, and a sectional view thereof corresponds to FIG. 5. More specifically, the semiconductor chip 210, the memory chip 230, and the package substrate 290, shown in FIG. 12, correspond to the semiconductor chip 10, the semiconductor chip 30, and the package substrate 90, shown in FIG. 4, or 5, respectively.

As shown in FIG. 12, the data (15:0) terminals provided in the electrode pad group 203 of the semiconductor chip 210 are coupled to the electrode pads provided in an electrode pad group 292 over the package substrate, respectively. The data (15:0) terminals provided in the electrode pad group 231 of the memory chip 230 are coupled to the electrode pads provided in the electrode pad group 292 over the package substrate, respectively. Further, the electrode pads over the package substrate 290, coupled to the data (15:0) terminals of the semiconductor chip 210, respectively, are coupled to the electrode pads over the package substrate 290, by use of an internal interconnect of the package substrate 290 (corresponding to the interconnect 98 in FIG. 4).

Similarly, the data (31:16) terminals provided in the electrode pad group 204 of the semiconductor chip 210 are coupled to the electrode pads provided in an electrode pad group 293 over the package substrate, respectively. The data (31:16) terminals provided in the electrode pad group 232 of the memory chip 230 are coupled to the electrode pads provided in the electrode pad group 293 over the package substrate, respectively. Further, the electrode pads over the package substrate 290, coupled to the data (31:16) terminals of the semiconductor chip 210, respectively, are coupled to the electrode pads over the package substrate 290, coupled to the data (31:16) terminals of the memory chip 230, respectively, by use of an internal interconnect of the package substrate 290 (corresponding to the interconnect 99 in FIG. 4).

The Add/cmd terminals provided in the electrode pad group 202 of the semiconductor chip 210 are coupled to the electrode pads provided in an electrode pad group 291 over the package substrate, respectively. The Add/cmd terminals provided in the electrode pad group 233 of the memory chip 230 are coupled to the electrode pads provided in the electrode pad group 291 over the package substrate, respectively. Further, the electrode pads over the package substrate 290, coupled to the Add/cmd terminals of the semiconductor chip 210, respectively, are coupled to the electrode pads over the package substrate 290, coupled to the Add/cmd terminals of the memory chip 230, respectively, by use of an internal interconnect of the package substrate 290 (corresponding to the interconnect 97 in FIG. 4). At this point in time, the electrode pad group 201 of the semiconductor chip 210 is not put to use.

The electrode pad group 231, and the electrode pad group 232 are disposed along the same side of the memory chip 230, and the electrode pad group 233 is disposed along one side of the memory chip 230, opposite to the side along which the electrode pad group 231, and the electrode pad group 232 are disposed. The electrode pad group 233 is provided with the Add/cmd terminals. In the case of an example shown in FIG. 12, if the semiconductor chip 210 and the memory chip 230 are stacked one another so as to be mounted, use is made of either of the electrode pad groups 201, 202 provided in the semiconductor chip 210, closer to the electrode pad group 233 (the Add/cmd terminal) of the memory chip 230. With the adoption of such a configuration as described, it is therefore possible to shorten a bonding wire length, and simplify the interconnect pattern of the package substrate.

With the semiconductor chip according to the present embodiment, when the multiple semiconductor chips are coupled with each other, the electrode pad group that is put to use is switched as described in the foregoing, so that it is possible to inhibit an increase in the length of an interconnect between the semiconductor chips, and complication in the interconnect. More specifically, through selection of the electrode pad to be put to use for every packaging configuration upon mounting, a bonding wire length, and a interconnect pattern on a substrate can be optimized on a package-by-package basis. By so doing, it is possible to provide a semiconductor chip capable of realizing reduction in cost when the semiconductor chip is mounted over a package substrate, miniaturization of the package substrate, and optimization of an interconnect pattern, and a semiconductor device using the semiconductor chip.

Second Embodiment

Figure 14:
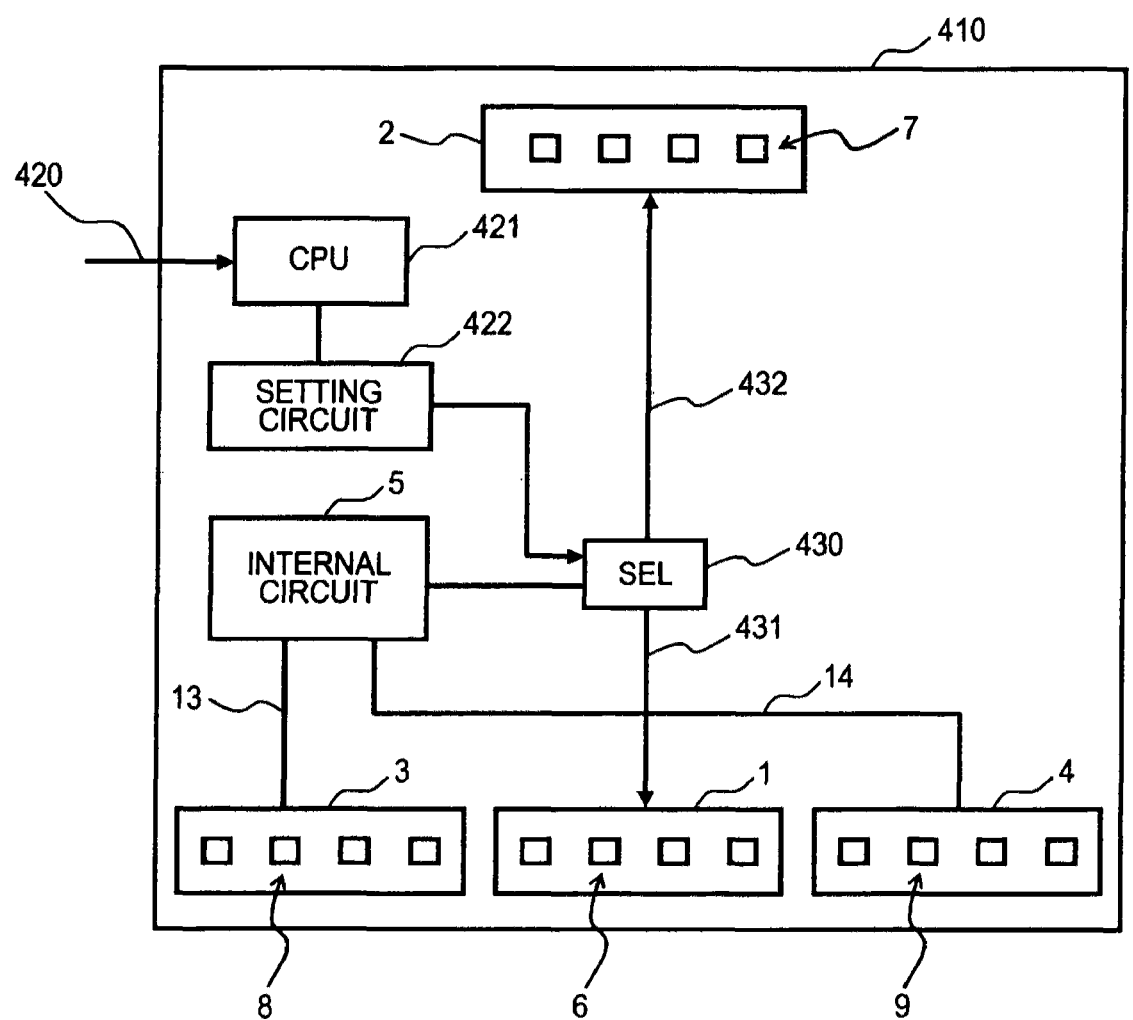
FIG. 14 is a view showing a semiconductor chip according to a second embodiment of the invention.

Next, there is described hereinafter a second embodiment of the invention. FIG. 14 is a view showing a semiconductor chip according to the second embodiment of the invention. The semiconductor chip 410 according to the present embodiment comprises a selector circuit 430 for selectively outputting an output signal from an internal circuit 5 to either an electrode pad group 1 or an electrode pad group 2, a setting circuit 422, and a CPU 421. The present embodiment is identical in configuration to the first embodiment except for the above mentioned, and therefore, identical constituents are denoted by like reference numerals, omitting duplication in description.

The selector circuit 430 of the semiconductor chip 410 shown in FIG. 14, selectively outputs the output signal from the internal circuit 5 to either of multiple electrode pads provided in the electrode pad group 1, and multiple electrode pads provided in the electrode pad group 2. More specifically, the selector circuit 430 switches over between the case of outputting the signal from the internal circuit 5 to the plural electrode pads of the electrode pad group 1 via an interconnect 431, and the case of outputting the signal from the internal circuit 5 to the plural electrode pads of the electrode pad group 2 via an interconnect 432.

The setting circuit 422 is a circuit for storing information on an output destination of a signal from selector circuit 430. The information on the output destination of the signal from selector circuit 430 is set on the basis of a user program stored in the CPU 421. The setting circuit 422 can be made up by use of, for example, a resistor circuit.

Figure 15:
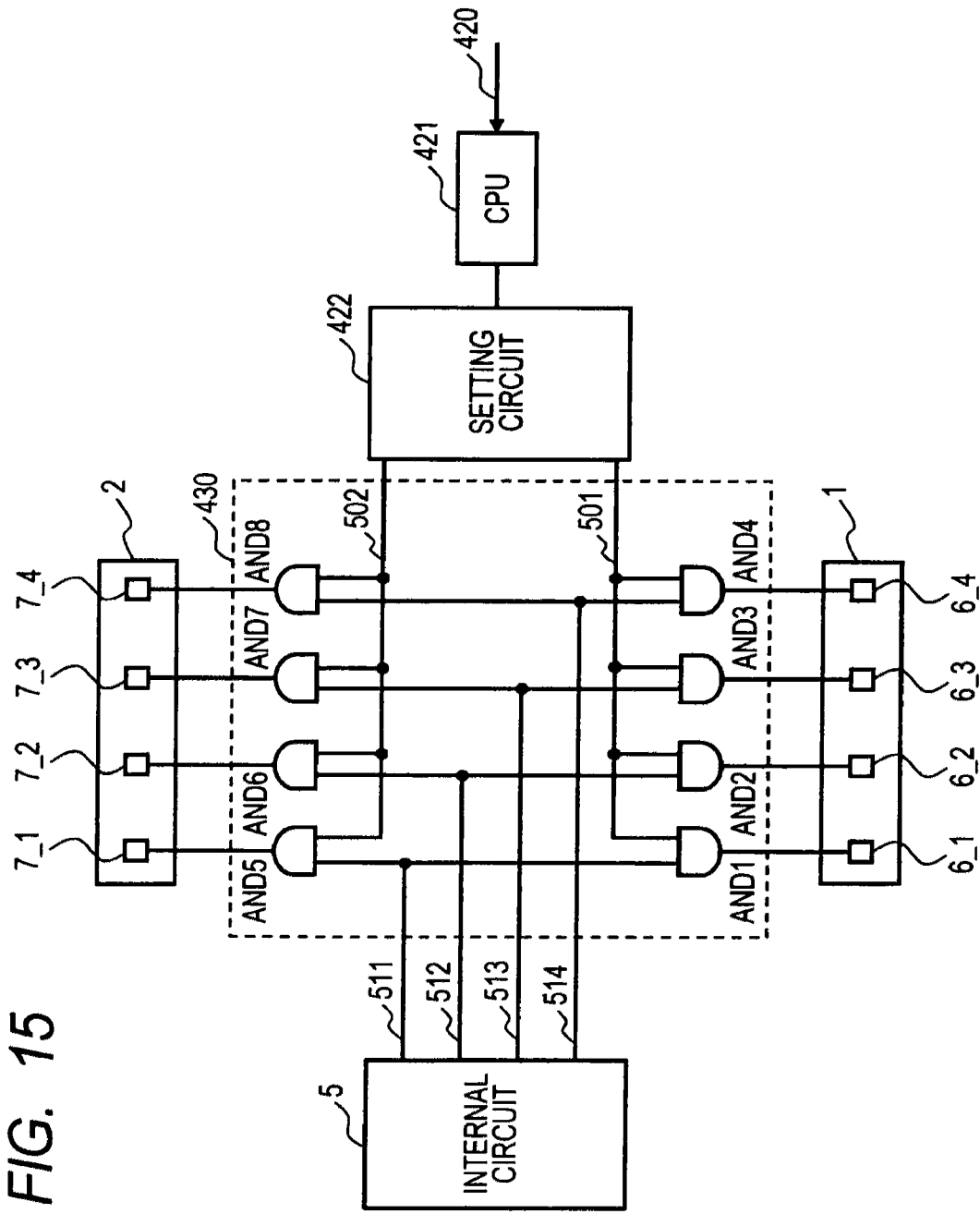
FIG. 15 is a view showing a specific example of a selector circuit of the semiconductor chip according to the second embodiment of the invention.

FIG. 15 is a view showing a specific example of the selector circuit 430. The selector circuit 430 comprises multiple AND circuits (AND1 to AND8). An output of AND1 is coupled to an electrode pad 6_1 of an electrode pad group 1. A signal 511 from the internal circuit 5 is supplied to one of inputs of AND1. A signal 501 from the setting circuit 422 is supplied to the other of the inputs of AND1. An output of AND5 is coupled to an electrode pad 7_1 of an electrode pad group 2. The signal 511 from the internal circuit 5 is supplied to one of inputs of AND5. A signal 502 from the setting circuit 422 is supplied to the other of the inputs of AND5.

Similarly, an output of AND2 is coupled to an electrode pad 6_2 of the electrode pad group 1. A signal 512 from the internal circuit 5 is supplied to one of inputs of AND2. The signal 501 from the setting circuit 422 is supplied to the other of the inputs of AND2. An output of AND6 is coupled to an electrode pad 7_2 of the electrode pad group 2. The signal 512 from the internal circuit 5 is supplied to one of inputs of AND6. The signal 502 from the setting circuit 422 is supplied to the other of the inputs of AND6.

Similarly, an output of AND3 is coupled to an electrode pad 6_3 of the electrode pad group 1. A signal 513 from the internal circuit 5 is supplied to one of inputs of AND3. The signal 501 from the setting circuit 422 is supplied to the other of the inputs of AND3. An output of AND7 is coupled to an electrode pad 7_3 of the electrode pad group 2. The signal 513 from the internal circuit 5 is supplied to one of inputs of AND7. The signal 502 from the setting circuit 422 is supplied to the other of the inputs of AND7.

Similarly, an output of AND4 is coupled to an electrode pad 6_4 of the electrode pad group 1. A signal 514 from the internal circuit 5 is supplied to one of inputs of AND4. The signal 501 from the setting circuit 422 is supplied to the other of the inputs of AND4. An output of AND8 is coupled to an electrode pad 7_4 of the electrode pad group 2. The signal 514 from the internal circuit 5 is supplied to one of inputs of AND8. The signal 502 from the setting circuit 422 is supplied to the other of the inputs of AND8.

As shown in FIG. 15, the common signal 511 from the internal circuit 5 is supplied to the one of the inputs of AND5 as well as AND1. The common signal 512 from the internal circuit 5 is supplied to the one of the inputs of AND6 as well as AND2. The common signal 513 from the internal circuit 5 is supplied to the one of the inputs of AND7 as well as AND3. The common signal 514 from the internal circuit 5 is supplied to the one of the inputs of AND8 as well as AND4. Further, the setting circuit 422 outputs a high-level signal to the AND circuits where the common signals 511, 512, 513, 514 from the internal circuit 5 are delivered, respectively. For example, in the case where the common signals 511, 512, 513, 514 from the internal circuit 5 are outputted to the electrode pads 6_1 to 6_4 of the electrode pad group 1, respectively, the setting circuit 422 outputs the high-level signal 501 to the other of the respective inputs of AND1 to AND4, while outputting a low-level signal 502 to the other of the respective inputs of AND5 to AND8, respectively. Conversely, in the case where the common signals 511, 512, 513, 514 from the internal circuit 5 are outputted to the electrode pads 7_1 to 7_4 of the electrode pad group 2, respectively, the setting circuit 422 outputs a high-level signal 502 to the other of the respective inputs of AND5 to AND8, while outputting a low-level signal 501 to the other of the respective inputs of AND1 to AND4.

Now, the selector circuit 430 shown in FIG. 15 is just one example, and use may be made of any circuit capable of realizing the same operation as described above.

If the selector circuit 430 described as above is provided, it is possible to inhibit output of the signal to the interconnect 431, or the interconnect 432, whichever interconnect is out of use, so that generation of an unnecessary current can be inhibited. Accordingly, it is possible to reduce power consumption of the semiconductor chip, and to inhibit mixing of noise from an unnecessary interconnect.

Figure 16:
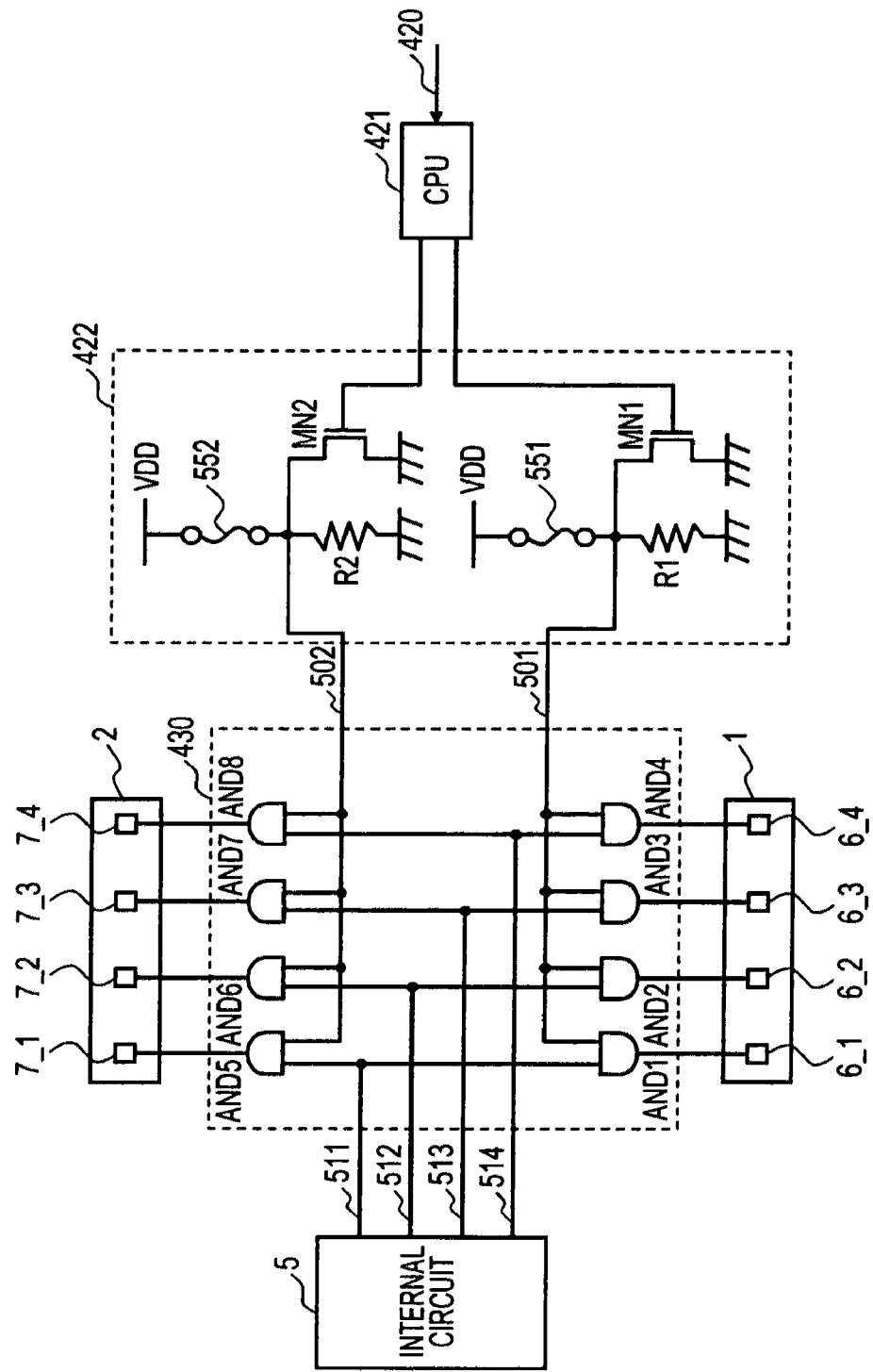
FIG. 16 is a view showing a specific example of a setting circuit of the semiconductor chip according to the second embodiment of the invention.
Figure 17:
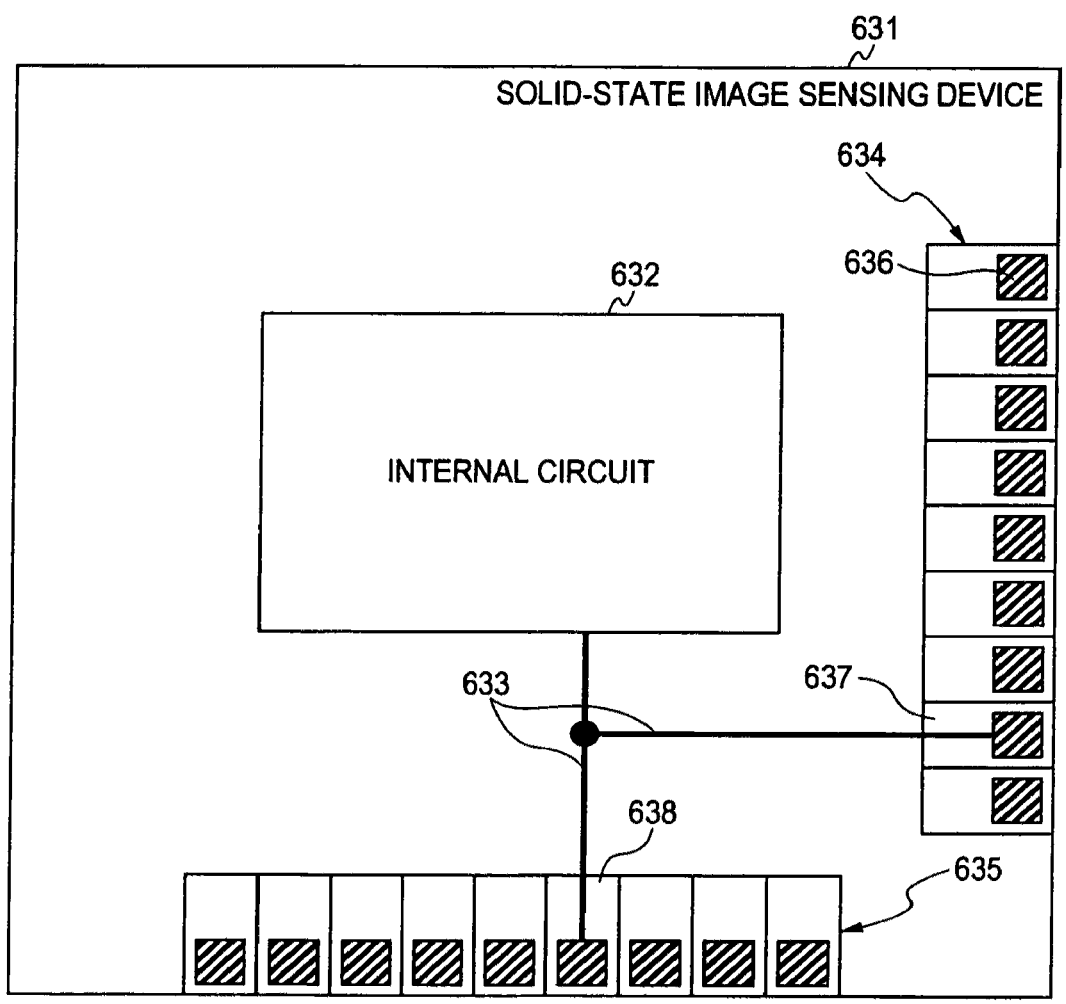
FIG. 17 is a view showing the solid-state image sensing device disclosed in Japanese Unexamined Patent Publication No. 2006-41343.

Subsequently, there is described hereinafter a specific example of the setting circuit with reference to FIG. 16. As shown in FIG. 16, the setting circuit 422 comprises resistors R1, R2, fuses 551, 552, and NMOS transistors MN1, MN2.

The NMOS transistor MN1 has a gate coupled to an output of the CPU 421, a source coupled to GND, and a drain coupled to a node (also described as a node 501) for outputting the signal 501. The fuse 551 has one end coupled to a power supply voltage VDD, and the other end coupled to the node 501. The resistor R1 has one end coupled to the node 501, and the other end coupled to GND.

Similarly, the NMOS transistor MN2 has a gate coupled to the output of the CPU 421, a source coupled to GND, and a drain coupled to a node (also described as a node 502) for outputting the signal 502. The fuse 552 has one end coupled to the power supply voltage VDD, and the other end coupled to the node 502. The resistor R2 has one end coupled to the node 502, and the other end coupled to GND.

For example, in the case of setting the setting circuit 422 so as to output a high-level signal to the node 501 while outputting a low-level signal to the node 502, the CPU 421 outputs a high-level signal to the gate of the NMOS transistor MN2 at the time of setting the setting circuit 422, whereupon the NMOS transistor MN2 is turned into on state, and current flows from the power supply voltage VDD to GND via the fuse 552, and the NMOS transistor MN2. A voltage of the power supply voltage VDD is set to a level sufficient to cut off the fuse 552 at this point in time. By so doing, the fuse 552 can be cut off at timing that the NMOS transistor MN2 is turned into the on state. On the other hand, the CPU 421 outputs a low-level signal to the gate of the NMOS transistor MN1 at this point in time. In this case, no current flows through the NMOS transistor MN1, so that the fuse 551 is not cut off.

Because the fuse 551 is not cut off, the setting circuit 422 consequently outputs the high-level signal (VDD1) to the node 501. On the other hand, because the fuse 552 is cut off, the setting circuit 422 outputs the low-level signal to the node 502.

Furthermore, in the case of setting the setting circuit 422 so as to output the low-level signal to the node 501 while outputting the high-level signal to the node 502, the CPU 421 outputs the high-level signal to the gate of the NMOS transistor MN1, and the low-level signal to the gate of the NMOS transistor MN2 at the time of setting the setting circuit 422.

Further, the setting circuit 422 shown in FIG. 16 is just one example, and use may be made of any circuit capable of realizing the same operation as described above. For example, the setting circuit 422 may be made up of resistors, and a CPU loaded with a user program may write a value to the respective resistors. Then, selection on which electrode pad should be coupled to one other semiconductor chip may be made according the value written to the respective resistors.

Having described the invention with reference to the embodiments given in the foregoing, it is our intention that the invention be not limited to the configurations of those embodiments only, and it goes without saying that various variations, modifications, and combinations which may occur to those skilled in the art are considered to be within the scope of the appended claims.

What is claimed is:

1. A semiconductor chip comprising:
   at least one first electrode pad provided in the semiconductor chip;
   a second electrode pad capable of outputting a signal identical to a signal outputted from the first electrode pad, the second electrode pad being at least one electrode pad provided in the semiconductor chip;
   an internal circuit for outputting a signal to at least either of the first electrode pad, and the second electrode pad: and
   a selector circuit for receiving a signal outputted from the internal circuit and outputting the signal to either of the first electrode pad, and the second electrode pad,
   wherein either of the first electrode pad and the second electrode pad, closer in distance to one other electrode pad of one other semiconductor chip where the signal is supplied, is coupled to the one other electrode pad of the one other semiconductor chip,
   wherein the selector circuit includes:
      a first AND circuit having an output terminal coupled to the first electrode pad, one input terminal for receiving the signal outputted from the internal circuit, the other input terminal for receiving a signal outputted from a setting circuit: and
      a second AND circuit having an output terminal coupled to the second electrode pad, one input terminal for receiving a signal identical to the signal outputted from the internal circuit to be supplied to the one input terminal of the first AND circuit, the other input terminal for receiving a second signal outputted from the setting circuit, and
   wherein the selector circuit varies respective signal levels of the first signal, and the second signal, outputted from the setting circuit, thereby switching the electrode pad to be coupled to the one other semiconductor chip.

2. The semiconductor chip according to claim 1, wherein the first electrode pad is provided along one side of the semiconductor chip, and the second electrode pad is provided along one side of the semiconductor chip, different from the one side thereof.

3. The semiconductor chip according to claim 1, wherein the semiconductor chip is provided over a package substrate, and the semiconductor chip together with the one other semiconductor chip provided over one other package substrate, different from the package substrate, is provided over a mounting board.

4. The semiconductor chip according to claim 1, wherein the semiconductor chip is provided over a package substrate, and the one other semiconductor chip is stacked over the semiconductor chip over the package substrate.

5. The semiconductor chip according to claim 1, wherein the one other semiconductor chip, and the semiconductor chip are disposed in a horizontal direction, and either of the first electrode pad, and the second electrode pad is coupled to the one other electrode pad, and
   wherein either of the first electrode pad, and the second electrode pad, not coupled to the one other electrode pad, when the one other semiconductor chip and the semiconductor chip are disposed in a horizontal direction to be coupled with each other, is coupled to the one other electrode pad when the one other semiconductor chip and the semiconductor chip are stacked on one another to be coupled with each other.

6. The semiconductor chip according to claim 1, wherein the setting circuit decides the respective signal levels of the first signal, and the second signal on the basis of electrode pad information set by a user program.

7. The semiconductor chip according to claim 1, wherein the setting circuit comprises a first fuse for deciding the signal level of the first signal, and a second fuse for deciding the signal level of the second signal.

8. The semiconductor chip according to claim 1, wherein the signal outputted from at least either of the first electrode pad, and the second electrode pad comprises an address and command signal.

9. The semiconductor chip according to claim 1, wherein the first electrode pad is provided along one side of the semiconductor chip, the second electrode pad is provided along one other side thereof, different from the one side along which the first electrode pad is provided, and further, at least one third electrode pad is provided along one side of the semiconductor chip, different from either of the one side of the semiconductor chip, along which the first electrode pad is provided, and the one other side thereof, along which the second electrode pad is provided, and wherein a signal outputted from the third electrode pad is a data signal.

10. A semiconductor device comprising:

the semiconductor chip according to claim 9; and one other semiconductor chip to be coupled to the semiconductor chip, wherein the third electrode pad of the semiconductor chip is provided along the one side of the semiconductor chip, along which the first electrode pad is provided, wherein the one other semiconductor chip is a memory chip, and also an electrode pad for receiving an address and command signal is disposed along one side of the memory chip, wherein while an electrode pad for receiving a data signal is disposed along one side of the memory chip, opposite to the one side thereof, wherein in the case where the semiconductor chip, and the one other semiconductor chip are disposed in a horizontal direction, respectively, to be coupled with each other, the first electrode pad of the semiconductor chip is coupled to the electrode pad of the one other semiconductor chip, for receiving the address and command signal, and wherein in the case where the semiconductor chip, and the memory chip are stacked one another to be coupled with each other, the second electrode pad of the memory chip is coupled to the electrode pad of the one other semiconductor chip, for receiving the address and command signal.

11. A semiconductor device comprising:

the semiconductor chip according to claim 1;

a first package substrate over which the semiconductor chip is mounted;

the one other semiconductor chip;

a second package substrate over which the one other semiconductor chip is mounted; and a mounting board where the first package substrate over which the semiconductor chip is mounted, and the second package substrate over which the one other semiconductor chip is mounted are mounted, wherein the semiconductor chip is coupled to the one other semiconductor chip via the first package substrate, the mounting board, and the second package substrate.

12. A semiconductor device comprising:

the semiconductor chip according to claim I;

the one other semiconductor chip stacked over the semiconductor chip so as to be mounted; and a third package substrate over which the semiconductor chip, and the one other semiconductor chip are mounted, wherein the semiconductor chip is coupled to the one other semiconductor chip via the third package substrate.

13. A semiconductor device comprising:

a package substrate;

a first electrode pad provided over the package substrate;

a second electrode pad different from the first electrode pad, the second electrode pad being provided over the package substrate;

a semiconductor chip provided over the package substrate;

a third electrode pad provided over the semiconductor chip; and a fourth electrode pad different from the third electrode pad, provided over the semiconductor chip, the fourth electrode pad being capable of outputting a signal identical to a signal outputted from the third electrode pad, wherein the semiconductor chip comprises:

an internal circuit for outputting a signal to at least either of the third electrode pad, and the fourth electrode pad; and a selector circuit for receiving a signal outputted from the internal circuit and outputting the signal to either of the third electrode pad, and the fourth electrode pad, the selector circuit including:

a first AND circuit having an output terminal coupled to the third electrode pad, one input terminal for receiving the signal outputted from the internal circuit the other input terminal for receiving a first signal outputted from a setting circuit, and a second AND circuit having an output terminal coupled to the fourth electrode pad, one input terminal for receiving a signal identical to the signal outputted from the internal circuit to be supplied to the one input terminal of the first AND circuit, the other input terminal for receiving a second signal outputted from the setting circuit, and wherein the selector circuit varies respective signal levels of the first signal, and the second signal, outputted from the setting circuit, thereby switching the electrode pad to be coupled to the package substrate.

\* \* \* \* \*